(12) United States Patent
King et al.

(10) Patent No.: US 9,634,566 B2
(45) Date of Patent: Apr. 25, 2017

(54) CONTROLLING THE COMMON MODE VOLTAGE OF A NON-ISOLATED BUCK-BOOST CONVERTER

(71) Applicant: Cirrus Logic, Inc., Austin, TX (US)

(72) Inventors: Eric J. King, Dripping Springs, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 14/612,946

(22) Filed: Feb. 3, 2015

(65) Prior Publication Data

US 2015/0222185 A1 Aug. 6, 2015

Related U.S. Application Data

(60) Provisional application No. 61/935,725, filed on Feb. 4, 2014, provisional application No. 61/990,363, filed
(Continued)

(51) Int. Cl.
*H02M 3/158* (2006.01)
*H03F 1/02* (2006.01)
(Continued)

(52) U.S. Cl.
CPC .......... *H02M 3/158* (2013.01); *H03F 1/0227* (2013.01); *H03F 1/0238* (2013.01);
(Continued)

(58) Field of Classification Search
CPC ... H02M 2001/0083; H02M 2001/009; H02M 3/1582; H02M 7/539; H02M 7/5395;
(Continued)

(56) References Cited

U.S. PATENT DOCUMENTS 4,186,437 A 1/1980 Cuk
5,077,539 A 12/1991 Howatt
(Continued)

FOREIGN PATENT DOCUMENTS

DE 10126236 A1 12/2002
EP 1374394 A2 1/2004
(Continued)

OTHER PUBLICATIONS

"Multivoltage Power supply circuit using IC-78xx series". Elec-Circuit Admin. Jan. 19, 2011. pp. 1-3.*
(Continued)

*Primary Examiner* — Harry Behm
*Assistant Examiner* — Peter Novak
(74) *Attorney, Agent, or Firm* — Jackson Walker L.L.P.

(57) ABSTRACT

A switching power stage for producing an output voltage to a load may include a power converter and a controller. The power converter may include a power inductor and plurality of switches arranged to sequentially operate in a plurality of switch configurations. The controller may be configured to, based at least on an input signal to the switching power stage, determine the differential output voltage to be driven at the load, and based on the differential output voltage to be driven at the load, apply a switch configuration from the plurality of switch configurations to selectively activate or deactivate each of the plurality of switches in order to generate the differential output voltage.

38 Claims, 11 Drawing Sheets

Related U.S. Application Data on May 8, 2014, provisional application No. 62/072,059, filed on Oct. 29, 2014.

(51) Int. Cl.
   *H03F 3/185* (2006.01)
   *H03F 3/217* (2006.01)
   *H04R 1/00* (2006.01)
   *H03F 3/181* (2006.01)

(52) U.S. Cl.
   CPC ............ *H03F 3/181* (2013.01); *H03F 3/185* (2013.01); *H03F 3/217* (2013.01); *H03F 3/2178* (2013.01); *H04R 1/00* (2013.01); *H03F 2200/03* (2013.01); *H03F 2200/504* (2013.01)

(58) Field of Classification Search
   CPC .... H02M 2001/008; G05F 1/44; G05F 1/445; H03F 3/181; H03F 3/183; H03F 3/185
   USPC .............................. 381/323; 330/251, 207 A
   See application file for complete search history.

(56) References Cited

U.S. PATENT DOCUMENTS

| | | | |
|---|---|---|---|
| 5,216,379 A | 6/1993 | Hamley | |
| 5,231,360 A | 7/1993 | Storey | |
| 5,442,317 A * | 8/1995 | Stengel | H02M 3/158 330/10 |
| 5,907,235 A | 5/1999 | Blumenkrantz et al. | |
| 6,060,950 A | 5/2000 | Groe | |
| 6,150,798 A | 11/2000 | Ferry et al. | |
| 6,166,527 A | 12/2000 | Dwelley et al. | |
| 6,348,781 B1 | 2/2002 | Midya et al. | |
| 6,661,285 B1 | 12/2003 | Pompei et al. | |
| 7,129,680 B2 | 10/2006 | Higashitani et al. | |
| 7,176,667 B2 | 2/2007 | Chen et al. | |
| 7,265,524 B2 | 9/2007 | Jordan et al. | |
| 7,391,190 B1 | 6/2008 | Rajagopalan | |
| 7,495,419 B1 | 2/2009 | Ju | |
| 7,499,557 B1 | 3/2009 | Yang et al. | |
| 7,863,841 B2 | 1/2011 | Menegoli et al. | |
| 7,863,872 B2 | 1/2011 | Chiu | |
| 7,952,900 B2 | 5/2011 | Tomiyoshi et al. | |
| 8,143,945 B2 | 3/2012 | Jurzitza | |
| 8,228,118 B1 | 7/2012 | Hsieh | |
| 8,232,787 B2 | 7/2012 | De Cremoux | |
| 8,269,471 B2 | 9/2012 | Singnurkar | |
| 8,269,472 B2 | 9/2012 | Lin | |
| 8,415,937 B2 | 4/2013 | Hester | |
| 8,637,909 B1 | 1/2014 | Vorhaus | |
| 8,638,168 B1 | 1/2014 | Signoff et al. | |
| 8,860,387 B2 | 10/2014 | Kobayashi | |
| 9,077,206 B2 * | 7/2015 | Zhang | H02J 3/383 |
| 9,088,211 B2 | 7/2015 | Ivanov et al. | |
| 9,287,781 B2 | 3/2016 | Wilson | |
| 2001/0040521 A1 | 11/2001 | Albinet et al. | |
| 2002/0167354 A1 | 11/2002 | Stanley | |
| 2002/0171475 A1 | 11/2002 | Picha et al. | |
| 2004/0135562 A1 * | 7/2004 | Oden | H02M 3/158 323/282 |
| 2007/0018719 A1 | 1/2007 | Seven | |
| 2007/0057720 A1 | 3/2007 | Hand et al. | |
| 2007/0279024 A1 | 12/2007 | Falvey | |
| 2008/0012639 A1 | 1/2008 | Mels | |
| 2008/0055946 A1 | 3/2008 | Lesso et al. | |
| 2008/0164766 A1 * | 7/2008 | Adest | H02J 1/12 307/80 |
| 2008/0310046 A1 | 12/2008 | Menegoli et al. | |
| 2009/0146623 A1 | 6/2009 | De Cremoux et al. | |
| 2010/0019844 A1 | 1/2010 | Metzger et al. | |
| 2010/0039080 A1 | 2/2010 | Schoenbauer et al. | |
| 2010/0157638 A1 * | 6/2010 | Naiknaware | H02M 7/4807 363/131 |
| 2010/0194359 A1 | 8/2010 | Notman | |
| 2011/0050349 A1 | 3/2011 | Strickland et al. | |
| 2011/0101948 A1 | 5/2011 | Lopata et al. | |
| 2011/0222326 A1 * | 9/2011 | Gray | H02M 7/53875 363/132 |
| 2011/0228945 A1 | 9/2011 | Mihelich et al. | |
| 2012/0049816 A1 | 3/2012 | Hester | |
| 2012/0262142 A1 | 10/2012 | Chen et al. | |
| 2012/0319669 A1 | 12/2012 | Chen et al. | |
| 2013/0082771 A1 | 4/2013 | Delano | |
| 2013/0121512 A1 | 5/2013 | Chen | |
| 2013/0207731 A1 | 8/2013 | Balteanu | |
| 2013/0249523 A1 | 9/2013 | Knott et al. | |
| 2013/0293204 A1 | 11/2013 | Lu | |
| 2014/0210437 A1 | 7/2014 | Chen | |
| 2014/0210439 A1 | 7/2014 | Chiu et al. | |
| 2014/0369529 A1 * | 12/2014 | Quinn | H03F 1/0233 381/121 |
| 2015/0030183 A1 | 1/2015 | Pazhayaveetil et al. | |
| 2015/0032396 A1 | 1/2015 | Pazhayaveetil et al. | |
| 2015/0123627 A1 | 5/2015 | Veeramreddi et al. | |
| 2015/0222184 A1 | 8/2015 | Melanson et al. | |
| 2015/0222185 A1 | 8/2015 | King et al. | |
| 2015/0222235 A1 | 8/2015 | Swanson et al. | |
| 2015/0323947 A1 | 11/2015 | Amadi et al. | |
| 2015/0326125 A1 | 11/2015 | King et al. | |
| 2015/0326126 A1 | 11/2015 | Maru et al. | |
| 2015/0326187 A1 | 11/2015 | Maru et al. | |
| 2016/0126908 A1 | 5/2016 | King et al. | |

FOREIGN PATENT DOCUMENTS

| | | |
|---|---|---|
| EP | 1432120 A1 | 6/2004 |
| EP | 2096752 A1 | 9/2009 |
| EP | 2395657 A1 | 12/2011 |
| EP | 2432119 A1 | 3/2012 |
| EP | 2587665 A1 | 5/2013 |
| EP | 2709272 A1 | 3/2014 |
| EP | 2768136 A1 | 8/2014 |
| GB | 2533994 A | 7/2016 |
| JP | 2008289047 A | 11/2008 |
| WO | 2011019588 A1 | 2/2011 |
| WO | 2015119956 A2 | 8/2015 |
| WO | 2015119958 A1 | 8/2015 |
| WO | 2015119961 A1 | 8/2015 |
| WO | 2015171931 A1 | 11/2015 |
| WO | 2015171935 A1 | 11/2015 |
| WO | 2015171937 A1 | 11/2015 |
| WO | 2015171940 A1 | 11/2015 |
| WO | 2016069366 A2 | 5/2016 |

OTHER PUBLICATIONS

Van Der Zee, R.A.R. et al., A Power Efficient Audio Amplifier Combining Switching and Linear Techniques, Proceedings of the 24th European Solid-State Circuits Conference, 1998, ESSCIRC '98, pp. 288-291.

International Search Report and Written Opinion, App. No. PCT/US2015/014282, mailed Jul. 9, 2015, 18 pages.

International Search Report and Written Opinion, App. No. PCT/US2015/029765, mailed Aug. 19, 2015, 11 pages.

International Search Report and Written Opinion, App. No. PCT/US2015/029753, mailed Aug. 20, 2015, 11 pages.

International Search Report and Written Opinion, App. No. PCT/US2015/029761, mailed Aug. 20, 2015, 11 pages.

International Search Report and Written Opinion of the International Searching Authority, International Application No. PCT/US2015/014292, mailed Apr. 22, 2015, 11 pages.

International Search Report and Written Opinion, App. No. PCT/US2015/0014274, mailed Aug. 24, 2015, 20 pages.

International Search Report and Written Opinion, App. No. PCT/US2015/029747, mailed Sep. 17, 2015, 13 pages.

Himmelstoss, F.A., et al., Compensated Class-D Amplifier as High Quality AC-Voltage Source, Power Electronics and Drive Systems, 1999, PEDS '99 Proceedings of the IEEE 1999 International Conference, Jul. 27-29, 1999, Piscataway, JN, USA, IEEE vol. 1, Jul. 27, 1999, pp. 116-120.

(56) References Cited

OTHER PUBLICATIONS

Combined Search and Examination Report, GB Application No. GB1518256.1, Apr. 15, 2016, 4 pages.
International Search Report and Written Opinion, International Application No. PCT/US2015/056846, mailed Apr. 22, 2016, 20 pages.
"Multivoltage Power Supply Circuit Using IC-78xx Series", Elec-Circuit Admin., Jan. 19, 2011, pp. 1-3.

* cited by examiner

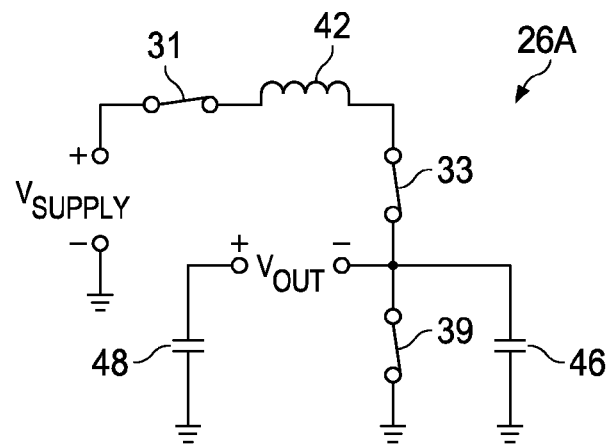
FIG. 6
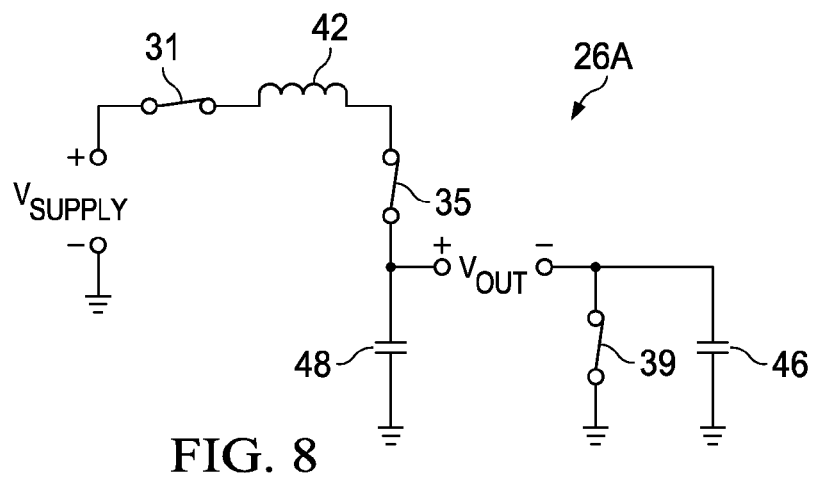
FIG. 7
FIG. 8

| INTEGRATED ERROR | PHASE | SWITCH STATES | | | | | |
|---|---|---|---|---|---|---|---|
| +/- | T1/T2 | 31 | 33 | 35 | 37 | 38 | 39 |
| + | T1 | 1 | 1 | 0 | 0 | 0 | 1 |
| + | T2 | 0 | 0 | 1 | 1 | 0 | 1 |
| - | T1 | 1 | 0 | 1 | 0 | 1 | 0 |
| - | T2 | 0 | 1 | 0 | 1 | 1 | 0 |
FIG. 9
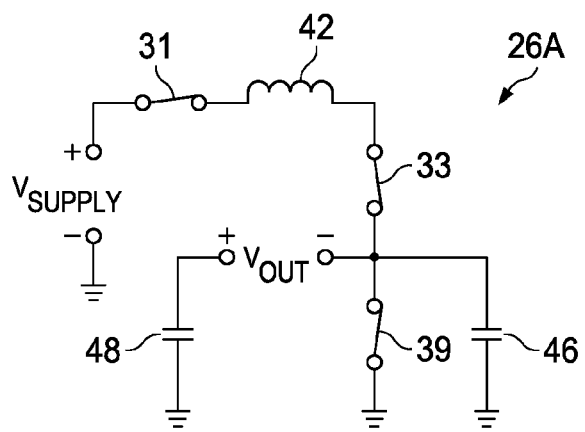
FIG. 10
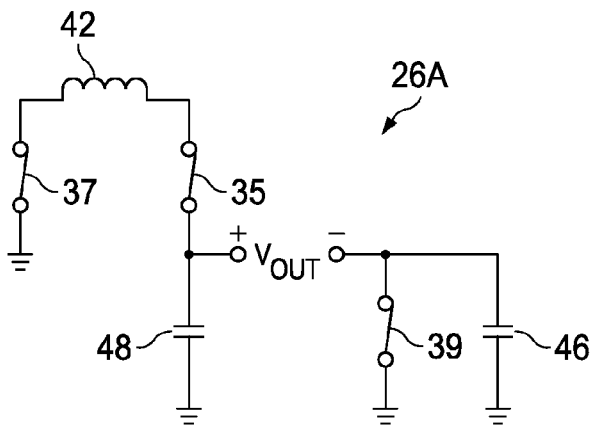
FIG. 11

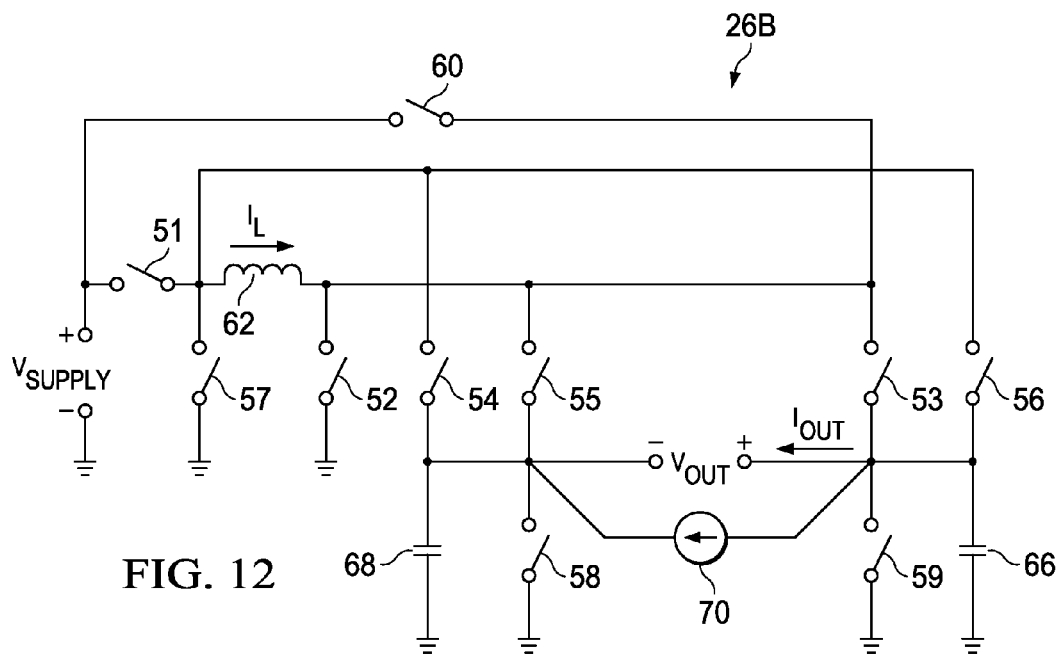
FIG. 12
| V_OUT | PHASE | SWITCH STATES | | | | | | | | | |
|---|---|---|---|---|---|---|---|---|---|---|---|
| +/- | T1/T2 | 51 | 52 | 53 | 54 | 55 | 56 | 57 | 58 | 59 | 60 |
| + | T1 | 1 | 1 | 0 | 0 | 0 | 0 | 0 | 1 | 0 | 0 |
| + | T2 | 1 | 0 | 1 | 0 | 0 | 0 | 0 | 1 | 0 | 0 |
| - | T1 | 1 | 1 | 0 | 0 | 0 | 0 | 0 | 0 | 1 | 0 |
| - | T2 | 1 | 0 | 0 | 0 | 1 | 0 | 0 | 0 | 1 | 0 |
FIG. 13
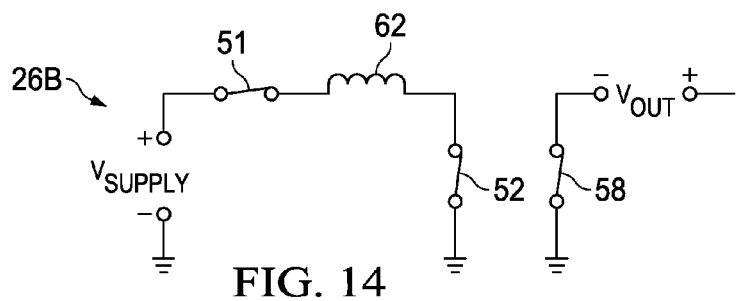
FIG. 14

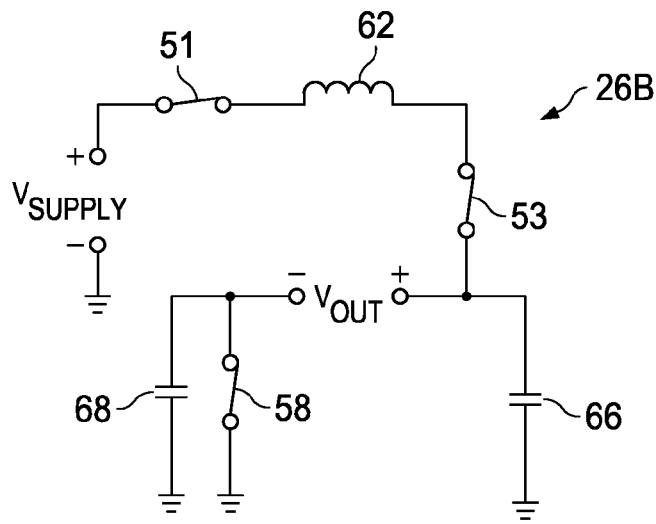
FIG. 15
| $V_{OUT}$ | PHASE | SWITCH STATES | | | | | | | | | |
|---|---|---|---|---|---|---|---|---|---|---|---|
| +/- | T1/T2 | 51 | 52 | 53 | 54 | 55 | 56 | 57 | 58 | 59 | 60 |
| + | T1 | 1 | 1 | 0 | 0 | 0 | 0 | 0 | 0 | 0 | 0 |
| + | T2 | 0 | 0 | 1 | 1 | 0 | 0 | 0 | 0 | 0 | 0 |
| - | T1 | 1 | 1 | 0 | 0 | 0 | 0 | 0 | 0 | 0 | 0 |
| - | T2 | 0 | 0 | 0 | 0 | 1 | 1 | 0 | 0 | 0 | 0 |
FIG. 16
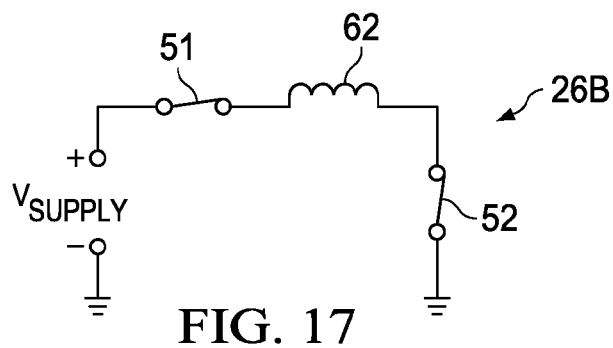
FIG. 17

| $V_{OUT}$ | CM | STATE | SWITCH STATES | | | | | | | | | |
|---|---|---|---|---|---|---|---|---|---|---|---|---|
| +/- | +/- | T1/T2 | 51 | 52 | 53 | 54 | 55 | 56 | 57 | 58 | 59 | 60 |
| + | + | T1 | 1 | 0 | 1 | 0 | 0 | 0 | 0 | 0 | 0 | 0 |
| + | + | T2 | 0 | 0 | 1 | 1 | 0 | 0 | 0 | 0 | 0 | 0 |
| + | - | T1 | 0 | 1 | 0 | 1 | 0 | 0 | 0 | 0 | 0 | 0 |
| + | - | T2 | 0 | 0 | 1 | 1 | 0 | 0 | 0 | 0 | 0 | 0 |
| - | + | T1 | 1 | 0 | 0 | 0 | 1 | 0 | 0 | 0 | 0 | 0 |
| - | + | T2 | 0 | 0 | 0 | 0 | 1 | 1 | 0 | 0 | 0 | 0 |
| - | - | T1 | 0 | 1 | 0 | 0 | 0 | 1 | 0 | 0 | 0 | 0 |
| - | - | T2 | 0 | 0 | 0 | 0 | 1 | 1 | 0 | 0 | 0 | 0 |

US 9,634,566 B2

CONTROLLING THE COMMON MODE VOLTAGE OF A NON-ISOLATED BUCK-BOOST CONVERTER

RELATED APPLICATIONS

The present disclosure claims priority to U.S. Provisional Patent Application Ser. No. 61/935,725, filed Feb. 4, 2014, U.S. Provisional Patent Application Ser. No. 61/990,363, filed May 8, 2014, and U.S. Provisional Patent Application Ser. No. 62/072,059, filed Oct. 29, 2014, each of which is incorporated by reference herein in its entirety.

FIELD OF DISCLOSURE

The present disclosure relates in general to circuits for audio devices, including without limitation personal audio devices such as wireless telephones and media players, and more specifically, to a switch mode amplifier for driving an audio transducer of an audio device.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a speaker driver including a power amplifier for driving an audio output signal to headphones or speakers.

One existing approach to driving an audio output signal is to employ a speaker driver, such as speaker driver 100 depicted in FIG. 1. Speaker driver 100 may include an envelope-tracking boost converter 102 (e.g., a Class H amplifier) followed by a full-bridge output stage 104 (e.g., a Class D amplifier) which effectively operates as another converter stage. Boost converter 102 may include a power inductor 104, switches 106, 108, and a capacitor 110 arranged as shown. Full-bridge output stage 104 may include switches 112, 114, 116, and 118, inductors 120 and 124, and capacitors 122 and 126 as shown.

Speaker drivers such as speaker driver 100 suffer from numerous disadvantages. One disadvantage is that due to switching in output stage 104, such a speaker driver 100 may give rise to large amounts of radiated electromagnetic radiation, which may cause interference with other electromagnetic signals. Such radiated electromagnetic interference may be mitigated by LC filters formed using inductor 120 and capacitor 122 and inductor 124 and capacitor 126. However, such LC filters are often quite large in size, and coupling capacitors 122 and 124 to the terminals of the output transducer may have a negative impact on the power efficiency of speaker driver 100.

In addition, such architectures often do not handle large impulsive signals. To reduce power consumption, a power supply voltage $V_{SUPPLY}$ may be varied in accordance with the output signal, such that $V_{SUPPLY}$ may operate at lower voltage levels for lower output signal magnitudes. Thus, if a signal quickly increases, adequate time may not be present to increase voltage $V_{SUPPLY}$, thus leading to signal clipping unless a delay is placed in the signal path. However, adding a delay to a signal path may cause incompatibility with other types of audio circuits, such as adaptive noise cancellation circuits.

SUMMARY

In accordance with the teachings of the present disclosure, one or more disadvantages and problems associated with existing approaches to driving an audio output signal to an audio transducer may be reduced or eliminated.

In accordance with embodiments of the present disclosure, a switching power stage for producing an output voltage to a load may include a power converter and a controller. The power converter may include a power inductor, a plurality of switches, an output, and at least one capacitor. The plurality of switches may be arranged to sequentially operate in a plurality of switch configuration. The output may be for producing the output voltage comprising a first output terminal and a second output terminal, wherein a first switch of the plurality of switches is coupled between the power inductor and the first output terminal and a second switch of the plurality of switches is coupled between the power inductor and the second output terminal. The capacitor may be coupled to one of the first output terminal and the second output terminal. The controller may be configured to, based on a measured parameter associated with the switching power stage, select a selected operational mode of the power converter from a plurality of operational modes, and sequentially apply switch configurations from the plurality of switch configurations to selectively activate or deactivate each of the plurality of switches in order to transfer electrical energy from an input source of the power converter to the load in accordance with the selected operational mode.

In accordance with these and other embodiments of the present disclosure, a method for producing an output voltage to a load may include, based on a measured parameter associated with a switching power stage having a power converter comprising a power inductor, a plurality of switches arranged to sequentially operate in a plurality of switch configurations, an output for producing the output voltage comprising a first output terminal and a second output terminal, wherein a first switch of the plurality of switches is coupled between the power inductor and the first output terminal and a second switch of the plurality of switches is coupled between the power inductor and the second output terminal, at least one of: a capacitor coupled to the first output terminal and a capacitor coupled to the second output terminal, selecting a selected operational mode of the power converter from a plurality of operational modes. The method may also include sequentially applying a switch configurations from the plurality of switch configurations to selectively activate or deactivate each of the plurality of switches in order to transfer electrical energy from an input source of the power converter to the load in accordance with the selected operational mode.

In accordance with these and other embodiments of the present disclosure, a switching power stage for producing an output voltage to a load may include a power converter and a controller. The power converter may include a power inductor and plurality of switches arranged to sequentially operate in a plurality of switch configurations in accordance with a selected operational mode of the power converter, the selected operational selected from a plurality of operational modes. The plurality of operational modes may include a buck configuration wherein the plurality of switches are selectively enabled and disabled such that the power converter operates as a buck converter when in the buck configuration and a boost configuration wherein the plurality of switches are selectively enabled and disabled such that the power converter operates as a boost converter when in the boost configuration. The controller may be configured to sequentially apply switch configurations from the plurality of switch configurations to selectively activate or deactivate each of the plurality of switches in order to transfer electrical energy from an input source of the power converter to the load in accordance with the selected operational mode.

In accordance with these and other embodiments of the present disclosure, a method for producing an output voltage to a load may include sequentially operating a power converter comprising a power inductor and plurality of switches in a plurality of switch configurations in accordance with a selected operational mode of the power converter, the selected operational selected from a plurality of operational modes. The selected operation modes may include a buck configuration wherein the plurality of switches are selectively enabled and disabled such that the power converter operates as a buck converter when in the buck configuration and a boost configuration wherein the plurality of switches are selectively enabled and disabled such that the power converter operates as a boost converter when in the boost configuration. The method may also include sequentially applying switch configurations from the plurality of switch configurations to selectively activate or deactivate each of the plurality of switches in order to transfer electrical energy from an input source of the power converter to the load in accordance with the selected operational mode.

In accordance with these and other embodiments of the present disclosure, a switching power stage for producing an output voltage to a load may include a power converter and a controller. The power converter may include a power inductor and plurality of switches arranged to sequentially operate in a plurality of switch configurations. The controller may be configured to select a selected operational mode of the power converter from a plurality of operational modes, the plurality of operational modes comprising at least: (a) a first operational mode in which a first terminal of the load is at a voltage potential lower than that of a first terminal of a power source to the power converter and a second terminal of the load is at a voltage potential higher than that of a second terminal of the power source; and (b) a second operational mode in which one of the first terminal of the load and the second terminal of the load is coupled with a switch of the plurality of switches to one of the first terminal of the power source and the second terminal of the power source. The controller may also be configured to sequentially apply switch configurations from the plurality of switch configurations to selectively activate or deactivate each of the plurality of switches in order to transfer electrical energy from an input source of the power converter to the load in accordance with the selected operational mode.

In accordance with these and other embodiments of the present disclosure, a switching power stage for producing an output voltage to a load may include a power converter and a controller. The power converter may include a power inductor and plurality of switches arranged to sequentially operate in a plurality of switch configurations. The controller may be configured to, based at least on an input signal to the switching power stage, determine the differential output voltage to be driven at the load, and based on the differential output voltage to be driven at the load, apply a switch configuration from the plurality of switch configurations to selectively activate or deactivate each of the plurality of switches in order to generate the differential output voltage.

In accordance with these and other embodiments of the present disclosure, a method for producing an output voltage to a load may include selecting a selected operational mode for a power converter comprising a power inductor and plurality of switches arranged to sequentially operate in a plurality of switch configurations. The plurality of operational modes may include at least a first operational mode in which a first terminal of the load is at a voltage potential lower than that of a first terminal of a power source to the power converter and a second terminal of the load is at a voltage potential higher than that of a second terminal of the power source and a second operational mode in which one of the first terminal of the load and the second terminal of the load is coupled with a switch of the plurality of switches to one of the first terminal of the power source and the second terminal of the power source. The method may also include sequentially applying switch configurations from the plurality of switch configurations to selectively activate or deactivate each of the plurality of switches in order to transfer electrical energy from an input source of the power converter to the load in accordance with the selected operational mode.

In accordance with these and other embodiments of the present disclosure, a method for producing an output voltage to a load may include, based at least on an input signal to a switching power stage for producing a differential output voltage to a load, wherein the switching power stage comprises a power inductor and plurality of switches arranged to sequentially operate in a plurality of switch configurations, determining the differential output voltage to be driven at the load. The method may also include, based on the differential output voltage to be driven at the load, applying a switch configuration from the plurality of switch configurations to selectively activate or deactivate each of the plurality of switches in order to generate the differential output voltage.

In accordance with these and other embodiments of the present disclosure, a switching power stage for producing an output voltage to a load may include a power converter and a controller. The power converter may include a power inductor and plurality of switches arranged to sequentially operate in a plurality of switch configurations. The controller may be configured to sequentially apply the plurality of switch configurations to selectively activate or deactivate each of the plurality of switches in order to operate the power converter as a differential output buck converter, such that: (a) during a charging phase of the power converter, the power inductor is coupled between (i) one of a first terminal of a power source and a second terminal of the power source and (ii) one of a first terminal of the output load and a second terminal of the output load; (b) during a transfer phase of the power converter, at least one of the plurality of switches is activated in order to couple the power inductor between the first terminal of the output load and a second terminal of the output load; and (c) the output voltage comprises a differential voltage between the first terminal and the second terminal.

In accordance with these and other embodiments of the present disclosure, a method for producing an output voltage to a load may include, in a power converter comprising a power inductor and plurality of switches arranged to sequentially operate in the plurality of switch configurations, sequentially applying a plurality of switch configurations to selectively activate or deactivate each of the plurality of switches in order to operate the power converter as a differential output buck converter, such that: (a) during a charging phase of the power converter, the power inductor is coupled between (i) one of a first terminal of a power source and a second terminal of the power source and (ii) one of a first terminal of the output load and a second terminal of the output load; (b) during a transfer phase of the power converter, at least one of the plurality of switches is activated in order to couple the power inductor between the first terminal of the output load and a second terminal of the output load; and (c) the output voltage comprises a differential voltage between the first terminal and the second terminal.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 6 illustrates a table setting forth switch configurations of the power converter of FIG. 5 when operating in boost mode, in accordance with embodiments of the present disclosure;

FIG. 7 illustrates an equivalent circuit diagram of selected components of the power converter of FIG. 5 operating in a charging phase of a boost mode, in accordance with embodiments of the present disclosure;

FIG. 8 illustrates an equivalent circuit diagram of selected components of the power converter of FIG. 5 operating in a discharge phase of a boost mode, in accordance with embodiments of the present disclosure;

FIG. 9 illustrates a table setting forth switch configurations of the power converter of FIG. 5 when operating in buck mode, in accordance with embodiments of the present disclosure;

FIG. 10 illustrates an equivalent circuit diagram of selected components of the power converter of FIG. 5 operating in a charging phase of a buck mode, in accordance with embodiments of the present disclosure;

FIG. 11 illustrates an equivalent circuit diagram of selected components of the power converter of FIG. 5 operating in a discharge phase of a buck mode, in accordance with embodiments of the present disclosure;

FIG. 12 illustrates a circuit diagram of selected components of another example power converter, in accordance with embodiments of the present disclosure;

FIG. 13 illustrates a table setting forth switch configurations of the power converter of FIG. 12 when operating in a single-ended boost mode, in accordance with embodiments of the present disclosure;

FIG. 14 illustrates an equivalent circuit diagram of selected components of the power converter of FIG. 12 operating in a charging phase of a single-ended boost mode, in accordance with embodiments of the present disclosure;

FIG. 15 illustrates an equivalent circuit diagram of selected components of the power converter of FIG. 12 operating in a discharge phase of a single-ended boost mode, in accordance with embodiments of the present disclosure;

FIG. 16 illustrates a table setting forth switch configurations of the power converter of FIG. 12 when operating in a differential-output buck-boost mode, in accordance with embodiments of the present disclosure;

FIG. 17 illustrates an equivalent circuit diagram of selected components of the power converter of FIG. 12 operating in a charging phase of a differential-output buck-boost mode, in accordance with embodiments of the present disclosure;

DETAILED DESCRIPTION

Figure 1:
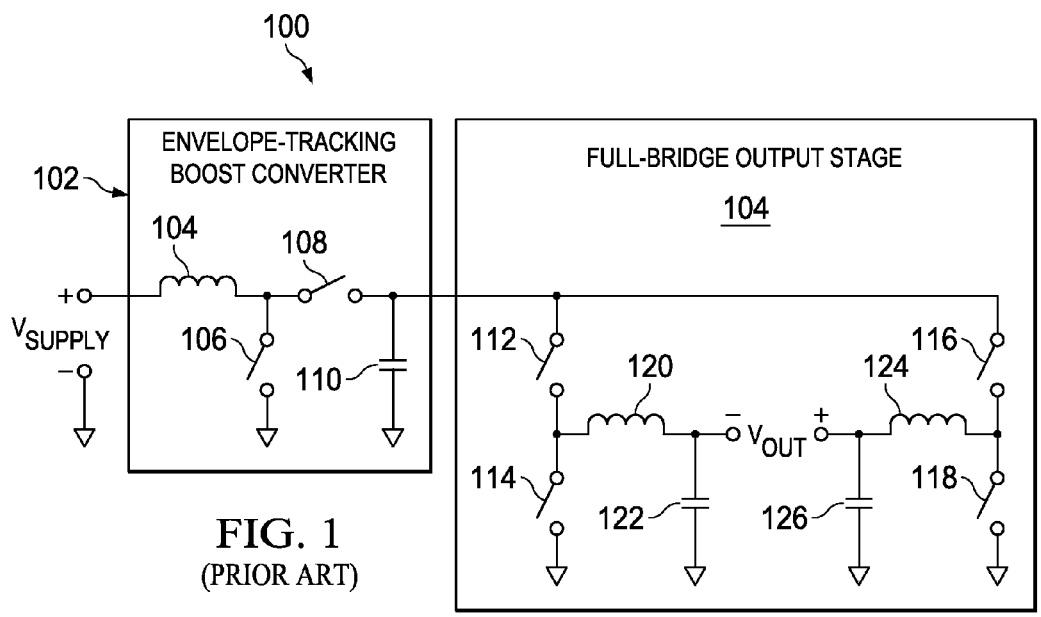
FIG. 1 illustrates an example speaker driver, as is known in the relevant art.
Figure 2:
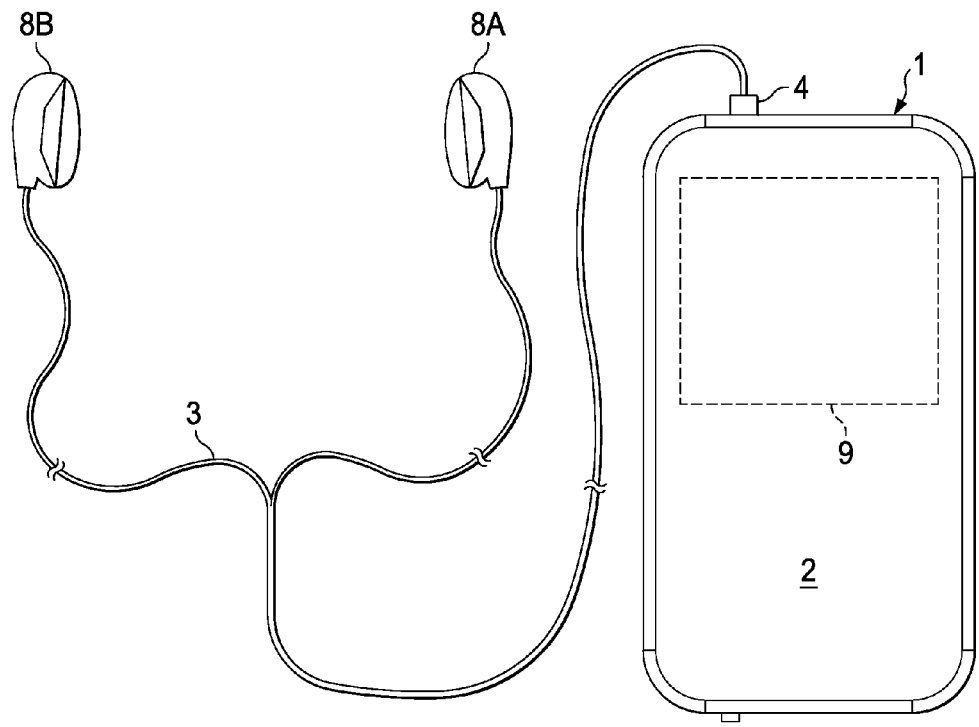
FIG. 2 illustrates an example personal audio device, in accordance with embodiments of the present disclosure.

FIG. 2 illustrates an example personal audio device 1, in accordance with embodiments of the present disclosure. FIG. 2 depicts personal audio device 1 coupled to a headset 3 in the form of a pair of earbud speakers 8A and 8B. Headset 3 depicted in FIG. 2 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 2, personal audio device 1 may include an audio integrated circuit (IC) 9 for generating an analog audio signal for transmission to headset 3 and/or another audio transducer.

Figure 3:
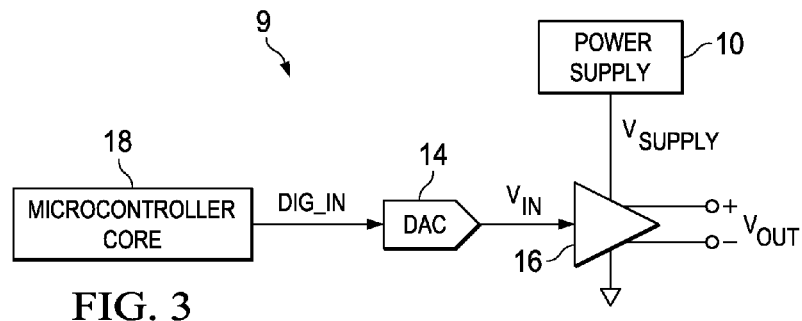
FIG. 3 illustrates a block diagram of selected components of an example audio integrated circuit of a personal audio device, in accordance with embodiments of the present disclosure.

FIG. 3 illustrates a block diagram of selected components of an example audio IC 9 of a personal audio device, in accordance with embodiments of the present disclosure. As shown in FIG. 3, a microcontroller core 18 may supply a digital audio input signal DIG_IN to a digital-to-analog converter (DAC) 14, which may convert the digital audio input signal to an analog signal $V_{IN}$. DAC 14 may supply analog signal $V_{IN}$ to an amplifier 16 which may amplify or attenuate audio input signal $V_{IN}$ to provide a differential audio output signal $V_{OUT}$, which may operate a speaker, headphone transducer, a line level signal output, and/or other suitable output. In some embodiments, DAC 14 may be an integral component of amplifier 16. A power supply 10 may provide the power supply rail inputs of amplifier 16. In some embodiments, power supply 10 may comprise a battery. Although FIGS. 2 and 3 contemplate that audio IC 9 resides in a personal audio device, systems and methods described herein may also be applied to electrical and electronic systems and devices other than a personal audio device, including audio systems for use in a computing device larger than a personal audio device, an automobile, a building, or other structure.

Figure 4:
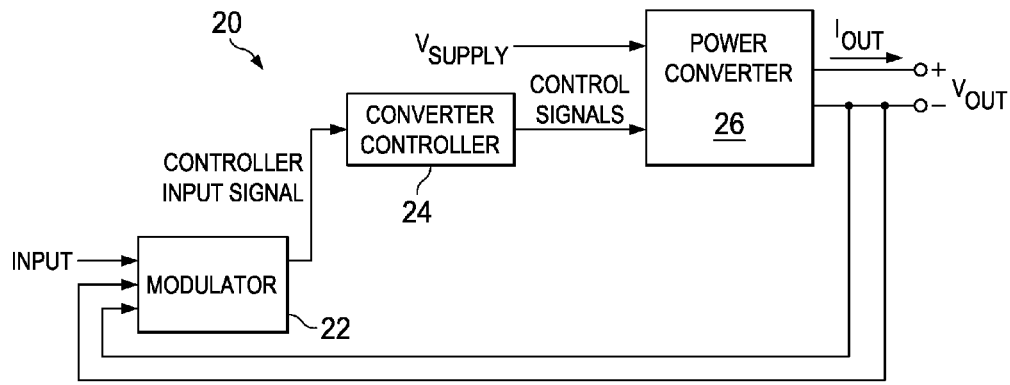
FIG. 4 illustrates a block and circuit diagram of selected components of an example switched mode amplifier, in accordance with embodiments of the present disclosure.

FIG. 4 illustrates a block and circuit diagram of selected components of an example switched mode amplifier 20, in accordance with embodiments of the present disclosure. In some embodiments, switched mode amplifier 20 may implement all or a portion of amplifier 16 described with respect to FIG. 3. As shown in FIG. 4, switched mode amplifier 20 may comprise a modulator 22, a converter controller 24, and a power converter 26.

Modulator 22 may comprise any system, device, or apparatus configured to receive an input signal (e.g., audio input signal $V_{IN}$ or a derivative thereof) and a feedback signal (e.g., audio output signal $V_{OUT}$, a derivative thereof, or other signal indicative of audio output signal $V_{OUT}$) and based on such input signal and feedback signal, generate a controller input signal to be communicated to converter controller 24. In some embodiments, such controller input signal may comprise a signal indicative of an integrated error between the input signal and the feedback signal, as is described in greater detail below with reference to FIGS. 6, 9 and 25. In other embodiments, such controller input signal may comprise a signal indicative of a target current signal to be driven as an output current $I_{OUT}$ to a load coupled to the output terminals of power converter 26, as described in greater detail below with reference to FIGS. 26 and 27.

Converter controller 24 may comprise any system, device, or apparatus configured to, based on the controller input signal, sequentially select among operational modes of power converter 26 and based on a selected operational mode, communicate a plurality of control signals to power converter 26 to apply a switch configuration from a plurality of switch configurations of switches of power converter 26 to selectively activate or deactivate each of the plurality of switches in order to transfer electrical energy from a power supply $V_{SUPPLY}$ to the load of switched-mode amplifier 20 in accordance with the selected operational mode. Examples of operational modes and switch configurations associated with each are described in greater detail elsewhere in this disclosure. Example implementations of converter controller 24 are also described in greater detail elsewhere in this disclosure. In addition, in some embodiments, converter controller 24 may control switches of a power converter 26 in order to regulate a common mode voltage of the output terminals of power converter 26 to the maximum of a first voltage associated with switched-mode amplifier 20 and a second voltage associated with switched-mode amplifier 20. In some embodiments, the first voltage may comprise one-half of the supply voltage $V_{SUPPLY}$. In these and other embodiments, the second voltage may comprise one-half of output voltage $V_{OUT}$, or another signal indicative of an expected voltage for output voltage $V_{OUT}$ (e.g, input voltage signal $V_{IN}$).

Power converter 26 may receive at its input a voltage $V_{SUPPLY}$ (e.g., provided by power supply 10) at its input, and may generate at its output audio output signal $V_{OUT}$. Although not explicitly shown in FIG. 3, in some embodiments, voltage $V_{SUPPLY}$ may be received via input terminals including a positive input terminal and a negative input terminal which may be coupled to a ground voltage. As described in greater detail in this disclosure, power converter 26 may comprise a power inductor and a plurality of switches that are controlled by control signals received from converter controller 24 in order to convert voltage $V_{SUPPLY}$ to audio output signal $V_{OUT}$, such that audio output signal $V_{OUT}$ is a function of the input signal to modulator 22. Examples of power converter 26 each are described in greater detail elsewhere in this disclosure.

Figure 5:
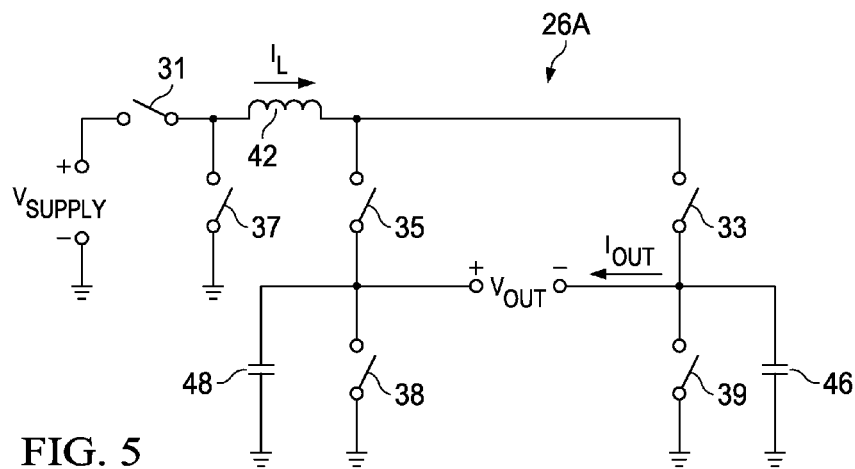
FIG. 5 illustrates a circuit diagram of selected components of an example power converter, in accordance with embodiments of the present disclosure.

FIG. 5 illustrates a circuit diagram of selected components of an example power converter 26A, in accordance with embodiments of the present disclosure. In some embodiments, power converter 26A depicted in FIG. 5 may implement all or a portion of power converter 26 described with respect to FIG. 4. As shown in FIG. 5, power converter 26A may receive at its input a voltage $V_{SUPPLY}$ (e.g., provided by power supply 10) at input terminals, including a positive input terminal and a negative input terminal which may be coupled to a ground voltage, and may generate at its output a differential output voltage $V_{OUT}$. Power converter 26A may comprise a power inductor 42, and a plurality of switches 31, 33, 35, 37, 38, and 39. Power inductor 42 may comprise any passive two-terminal electrical component which resists changes in electrical current passing through it and such that when electrical current flowing through it changes, a time-varying magnetic field induces a voltage in power inductor 42, in accordance with Faraday's law of electromagnetic induction, which opposes the change in current that created the magnetic field.

Each switch 31, 33, 35, 37, 38, and 39 may comprise any suitable device, system, or apparatus for making a connection in an electric circuit when the switch is enabled (e.g., closed or on) and breaking the connection when the switch is disabled (e.g., open or off) in response to a control signal received by the switch. For purposes of clarity and exposition, control signals for switches 31, 33, 35, 37, 38, and 39 (e.g., control signals communicated from converter controller 24) are not depicted although such control signals would be present to selectively enable and disable switches 31, 33, 35, 37, 38, and 39. In some embodiments, a switch 31, 33, 35, 37, 38, 39 may comprise an n-type metal-oxide-semiconductor field-effect transistor. Switch 31 may be coupled between the positive input terminal and a first terminal of power inductor 42. Switch 33 may be coupled between a negative terminal of the output of power converter 26A and a second terminal of power inductor 42. Switch 35 may be coupled between a positive terminal of the output of power converter 26A and the second terminal of power inductor 42. Switch 37 may be coupled between the first terminal of power inductor 42 and the ground voltage. Switch 38 may be coupled between the positive terminal of the output of power converter 26A and the ground voltage. Switch 39 may be coupled between the negative terminal of the output of power converter 26A and the ground voltage.

In addition to switches 31, 33, 35, 37, 38, 39 and power inductor 42, power converter 26A may include a first output capacitor 46 coupled between the negative terminal of the output of power converter 26A and the ground voltage and a second output capacitor 48 coupled between the positive terminal of the output of power converter 26A and the ground voltage. Each output capacitor 46 and 48 may comprise a passive two-terminal electrical component used to store energy electrostatically in an electric field, and may generate a current in response to a time-varying voltage across the capacitor.

As described above, a power converter 26A may operate in a plurality of different operational modes, and may sequentially operate in a number of switch configurations under each operational mode. The plurality of modes may include, without limitation, a boost mode, a buck mode, and a hold mode.

FIG. 6 illustrates a table setting forth switch configurations of power converter 26A when operating in the boost mode, in accordance with embodiments of the present disclosure. In the boost mode, power converter 26A may act as a boost converter to boost the magnitude of the output voltage $V_{OUT}$ above that of supply voltage $V_{SUPPLY}$. Power converter 26A may operate in a boost mode, for example, when the controller input signal indicates that a magnitude of an integrated error between output voltage $V_{OUT}$ and an input voltage signal to modulator 22 is above a threshold (e.g. $|V_{OUT}-V_{IN}|>1.5V$). As shown in FIG. 6, when the integrated error is positive, and during a charging phase T1 of power converter 26A, converter controller 24 may enable switches 31, 33, and 39 of power converter 26A, with such switch configuration resulting in the equivalent circuit depicted in FIG. 7. When the integrated error is positive, and during a discharge phase T2 of power converter 26A, converter controller 24 may enable switches 31, 35, and 39 of power converter 26A, with such switch configuration resulting in the equivalent circuit depicted in FIG. 8. Similarly, when the integrated error is negative, and during a charging phase T1 of power converter 26A, converter controller 24 may enable switches 31, 35, and 38 of power converter 26A. In addition, when the integrated error is negative, and during a discharge phase T2 of power converter 26A, converter controller 24 may enable switches 31, 33, and 38 of power converter 26A. Thus, in the boost mode, converter controller 24 may control switches of power converter 26A to charge capacitor 46 or capacitor 48 during the charging phase T1 and transfer charge to the same capacitor 46 or capacitor 48 from the power supply (e.g., power supply 10) during the discharge phase T2.

In some embodiments, when operating in the boost mode, converter controller 24 may operate to control switches of power converter 26A in two or more sub-modes of the boost mode. For example, for larger magnitudes of an integrated error between output voltage $V_{OUT}$ and an input voltage signal to modulator 22 (e.g., $|V_{OUT}-V_{IN}|>2.0V$), converter controller 24 may cause power converter 26A to cyclically operate in the charging phase T1 for one clock cycle and the discharge phase T2 for one clock cycle, to maximize the charge transferred to the output terminal of power converter 26A. On the other hand, for smaller magnitudes of an integrated error between output voltage $V_{OUT}$ and an input voltage signal to modulator 22 (e.g., $1.5$ $V<|V_{OUT}-V_{IN}|<2.0V$), converter controller 24 may cause power converter 26A to cyclically operate in the charging phase T1 for one clock cycle and the discharge phase T2 for two clock cycles, to transfer a smaller amount of charge to the output terminal of power converter 26A than would occur if the discharge phase T2 was asserted for only a single clock cycle.

FIG. 9 illustrates a table setting forth switch configurations of power converter 26A when operating in the buck mode, in accordance with embodiments of the present disclosure. In the buck mode, power converter 26A may act as a buck converter to generate a magnitude of the output voltage $V_{OUT}$ below that of supply voltage $V_{SUPPLY}$. Power converter 26A may operate in a buck mode, for example, when the controller input signal indicates that a magnitude of an integrated error between output voltage $V_{OUT}$ and an input voltage signal to modulator 22 is below the threshold for operating in the boost mode (e.g. $|V_{OUT}-V_{IN}|<1.5V$) but has a magnitude significantly above zero (e.g., e.g. $|V_{OUT}-V_{IN}|>0.25V$). As shown in FIG. 9, when the integrated error is positive, and during a charging phase T1 of power converter 26A, converter controller 24 may enable switches 31, 33, and 39 of power converter 26A, with such switch configuration resulting in the equivalent circuit depicted in FIG. 10. When the integrated error is positive, and during a discharge phase T2 of power converter 26A, converter controller 24 may enable switches 35, 37, and 39 of power converter 26A, with such switch configuration resulting in the equivalent circuit depicted in FIG. 11. Similarly, when the integrated error is negative, and during a charging phase T1 of power converter 26A, converter controller 24 may enable switches 31, 35, and 38 of power converter 26A. In addition, when the integrated error is negative, and during a discharge phase T2 of power converter 26A, converter controller 24 may enable switches 33, 37, and 38 of power converter 26A. Thus, in the buck mode, converter controller 24 may control switches of power converter 26A to charge capacitor 46 or capacitor 48 during the charging phase T1 and transfer charge between capacitor 46 and capacitor 48 during the discharge phase T2.

In some embodiments, when operating in the buck mode, converter controller 24 may operate to control switches of power converter 26A in two or more sub-modes of the buck mode. For example, for larger magnitudes of an integrated error between output voltage $V_{OUT}$ and an input voltage signal to modulator 22 (e.g., $0.75<|V_{OUT}-V_{IN}|<1.5V$), converter controller 24 may cause power converter 26A to cyclically operate in the charging phase T1 for one clock cycle and the discharge phase T2 for one clock cycle, to maximize the charge transferred to the output terminal of power converter 26A. On the other hand, for smaller magnitudes of an integrated error between output voltage $V_{OUT}$ and an input voltage signal to modulator 22 (e.g., $0.25$ $V<|V_{OUT}-V_{IN}|<0.75V$), converter controller 24 may cause power converter 26A to cyclically operate in the charging phase T1 for one clock cycle and the discharge phase T2 for two clock cycles, to transfer a smaller amount of charge to the output terminal of power converter 26A than would occur if the discharge phase T2 was asserted for only a single clock cycle.

In some embodiments, in addition to a boost mode and a buck mode, power converter 26A may operate in a hold mode. The hold mode may occur, for example, when the controller input signal indicates that a magnitude of an integrated error between output voltage $V_{OUT}$ and an input voltage signal is near zero (e.g. $|V_{OUT}-V_{IN}|<0.25V$). During such hold mode neither of capacitors 46 and 48 may be charged nor discharged during a charging phase of power converter 26A and in which no charge is transferred to or from capacitors 46 and 48 during a discharge phase of power converter 26A.

In some embodiments, converter controller 24 may control switches of power converter 26A such that the switches perform synchronous rectification, wherein all switches of power converter 26A are controlled (e.g., disabled if inductor current $I_L$ decrease to zero) in order to prevent inductor current $I_L$ from decreasing below zero. In other embodiments, power converter 26A may include a diode (e.g., with anode terminal coupled to power inductor 42 and cathode terminal coupled to switches 33 and 35) in order to prevent inductor current $I_L$ from decreasing below zero.

FIG. 12 illustrates a circuit diagram of selected components of an example power converter 26B, in accordance with embodiments of the present disclosure. In some embodiments, power converter 26B depicted in FIG. 12 may implement all or a portion of power converter 26 described with respect to FIG. 4. As shown in FIG. 12, power converter 26B may receive at its input a voltage $V_{SUPPLY}$ (e.g., provided by power supply 10) at input terminals, including a positive input terminal and a negative input terminal which may be coupled to a ground voltage, and may generate at its output a differential output voltage $V_{OUT}$. Power converter 26B may comprise a power inductor 62, a plurality of switches 51-60, and a linear amplifier 70. Power inductor 62 may comprise any passive two-terminal electrical component which resists changes in electrical current passing through it and such that when electrical current flowing through it changes, a time-varying magnetic field induces a voltage in power inductor 62, in accordance with Faraday's law of electromagnetic induction, which opposes the change in current that created the magnetic field.

Each switch 51-60 may comprise any suitable device, system, or apparatus for making a connection in an electric circuit when the switch is enabled (e.g., closed or on) and breaking the connection when the switch is disabled (e.g., open or off) in response to a control signal received by the switch. For purposes of clarity and exposition, control signals for switches 51-60 (e.g., control signals communicated from converter controller 24) are not depicted although such control signals would be present to selectively enable and disable switches 51-60. In some embodiments, a switch 51-60 may comprise an n-type metal-oxide-semiconductor field-effect transistor. Switch 51 may be coupled between the positive input terminal and a first terminal of power inductor 62. Switch 52 may be coupled between a second terminal of power inductor 62 and ground. Switch 53 may be coupled between a positive terminal of the output of power converter 26B and a second terminal of power inductor 62. Switch 54 may be coupled between a negative terminal of the output of power converter 26B and the first terminal of power inductor 62. Switch 55 may be coupled between a negative terminal of the output of power converter 26B and the second terminal of power inductor 62. Switch 56 may be coupled between a positive terminal of the output of power converter 26B and the first terminal of power inductor 62. Switch 57 may be coupled between the ground voltage and the first terminal of power inductor 62.

Switch 58 may be coupled between the negative terminal of the output of power converter 26B and the ground voltage. Switch 59 may be coupled between the positive terminal of the output of power converter 26B and the ground voltage. Switch 60 may be coupled between the positive input terminal the second terminal of power inductor 62.

Power converter 26B may be similar in structure to power converter 26A, in that switches 31, 33, 35, 37, 38, and 39 of power converter 26A are arranged in a manner similar to switches 51, 53, 55, 57, 58, and 59, respectively, of power converter 26B. However, power converter 26B additionally includes switches 52, 54, 56, and 60, which enables power converter 26B to operate in switch configurations of operational modes in which neither of the output terminals of power converter 26B are coupled to the ground voltage, whereas in power converter 26A, each switch configuration includes one of the output terminals of power converter 26A coupled to the ground voltage. By including such additional switches enabling operational modes in which neither of the output terminals of power converter 26B is coupled to the ground voltage, additional operational modes of power converter 26B may be provided, as described in greater detail below.

In addition to switches 51-60 and power inductor 62, power converter 26B may include a first output capacitor 66 coupled between the positive terminal of the output of power converter 26B and the ground voltage and a second output capacitor 68 coupled between the negative terminal of the output of power converter 26B and the ground voltage. Each output capacitor 66 and 68 may comprise a passive two-terminal electrical component used to store energy electrostatically in an electric field, and may generate a current in response to a time-varying voltage across the capacitor.

Linear amplifier 70, which is shown as a current source in FIG. 12, may comprise any system, device, or apparatus configured to generate a current in response to an input signal. In some embodiments, linear amplifier 70 may comprise a digital-to-analog converter (DAC) configured to convert a digital input signal (e.g., a digital signal indicative of a desired output current across a load coupled between the output terminals of power converter 26B) into an analog current. Functionality of linear amplifier 70 is described in greater detail elsewhere in this disclosure.

As described above, a power converter 26B may operate in a plurality of different operational modes, and may sequentially operate in a number of switch configurations under each operational mode. The plurality of modes may include, without limitation, a single-ended boost mode, a differential-output buck-boost mode, a differential-output buck mode, and a linear amplifier mode.

Power converter 26B may operate in a single-ended boost mode when output voltage $V_{OUT}$ has a magnitude significantly larger than the supply voltage $V_{SUPPLY}$ (e.g., $|V_{OUT}|>V_{SUPPLY}=2V$). FIG. 13 illustrates a table setting forth switch configurations of power converter 26B when operating in the single-ended boost mode, in accordance with embodiments of the present disclosure. As shown in FIG. 13, when output voltage $V_{OUT}$ is positive, and during a charging phase T1 of power converter 26B, converter controller 24 may enable switches 51, 52, and 58 of power converter 26B, with such switch configuration resulting in the equivalent circuit depicted in FIG. 14. In such switch configuration, power inductor 62 may be charged via a current flowing between the power supply (e.g., power supply 10) and ground. When output voltage $V_{OUT}$ is positive, and during a discharge phase T2 of power converter 26B, converter controller 24 may enable switches 51, 53, and 58 of power converter 26B, with such switch configuration resulting in the equivalent circuit depicted in FIG. 15. In such switch configuration, power inductor 62 may be discharged, with charge transferred from the power supply (e.g., power supply 10) to the positive terminal of the output of power converter 26B. Similarly, when output voltage $V_{OUT}$ is negative, and during the charging phase T1 of power converter 26B, converter controller 24 may enable switches 51, 52, and 59 of power converter 26B, wherein in accordance with such switch configuration, power inductor 62 may be charged via a current flowing between the power supply (e.g., power supply 10) and ground. In addition, when output voltage $V_{OUT}$ is negative, and during the discharge phase T2 of power converter 26B, converter controller 24 may enable switches 51, 55, and 59 of power converter 26B, wherein in accordance with such switch configuration, power inductor 62 may be discharged, with charge transferred from the power supply (e.g., power supply 10) to the negative terminal of the output of power converter 26B.

Notably, in the boost configuration, one of either of the terminals of the output of power converter 26B remains grounded in order to provide for operation in the boost mode, thus allowing power converter 26B to act as a boost converter when in the boost mode.

In some embodiments, it may be desirable to operate in a continuous current mode (CCM) as opposed to a discontinuous current mode (DCM) when operating power converter 26B in the single-ended boost mode. This preference is because a CCM boost converter may have lower root-means-square (e.g., ripple) currents compared to a corresponding DCM boost converter.

For an input voltage signal $V_I$ to modulator 22, modulator 22 may generate a target current signal $I_{TGT}$ as the controller input signal which may be given by $I_{TGT}=V_I/R_{OUT}$, where $R_{OUT}$ is an impedance of a load at the output of power converter 26B. A duration of charging phase T1 may be given by T1=(1−D)TT, where D is a unitless variable given by D=1−($V_{SUPPLY}/V_I$) and TT is a switching period of power converter 26B which is the sum of the durations of the charging phase T1 and the transfer phase T2 (e.g., TT=T1+T2). A change in power inductor current $I_L$ occurring during charging phase T1 may be given by $\Delta I_L$=T1×($V_{SUPPLY}/L$) where L is an inductance of power inductor 62. A minimum inductor current $I_{min}$ may be given by:

$$I_{min}=[2\times TT\times I_{TGT}\times(V_{SUPPLY}-V_I)/L-\Delta I_L^2]/\Delta I_L.$$

and a peak current $I_{pk}$ for inductor current IL may be given as $I_{pk}=I_{min}+\Delta I_L$.

Power converter 26B may operate in a differential-output buck-boost mode when output voltage $V_{OUT}$ has a magnitude lower than that for which the single-ended boost mode is appropriate (e.g., $|V_{OUT}|<V_{SUPPLY}+2V$) but higher than a particular threshold magnitude (e.g., $|V_{OUT}|>3V$) for which the duration of a charging phase T1 becomes too small to operate power converter 26B in a buck-boost mode. FIG. 16 illustrates a table setting forth switch configurations of power converter 26B when operating in the differential-output buck-boost mode, in accordance with embodiments of the present disclosure. As shown in FIG. 16, when output voltage $V_{OUT}$ is positive, and during a charging phase T1 of power converter 26B, converter controller 24 may enable switches 51 and 52 of power converter 26B, with such switch configuration resulting in the equivalent circuit depicted in FIG. 17. In such switch configuration, power inductor 62 may be charged via a current flowing between the power supply (e.g., power supply 10) and ground. When output voltage $V_{OUT}$ is positive, and during a discharge phase T2 of power converter 26B, converter controller 24 may enable switches 53 and 54 of power converter 26B, with such switch configuration resulting in the equivalent circuit depicted in FIG. 18. In such switch configuration, power inductor 62 may be discharged, with charge transferred from the negative terminal of the output of power converter 26B to the positive terminal of the output of power converter 26B. Similarly, when output voltage $V_{OUT}$ is negative, and during the charging phase T1 of power converter 26B, converter controller 24 may enable switches 51 and 52 of power converter 26B, wherein in accordance with such switch configuration, power inductor 62 may be charged via a current flowing between the power supply (e.g., power supply 10) and ground. In addition, when output voltage $V_{OUT}$ is negative, and during the discharge phase T2 of power converter 26B, converter controller 24 may enable switches 55 and 56 of power converter 26B, wherein in accordance with such switch configuration, power inductor 62 may be discharged, with charge transferred from the positive terminal of the output of power converter 26B to the negative terminal of the output of power converter 26B.

Thus, in the differential-output buck-boost mode, power inductor 62 may be charged from $V_{SUPPLY}$ to ground during charging phases T1, and in discharging phases T2, power inductor 62 may be coupled across the output terminals of a load at the output of power converter 26 in order to discharge power inductor 62 and create a differential output. Coupling power inductor 62 across the output terminals in a differential output fashion may lead to a greater charge differential between capacitors 66 and 68 than would be in a single-ended configuration (e.g., with one of the output terminals grounded). Thus, lower power inductor peak currents may be required to achieve the same output current.

Within the output voltage range of operation for the differential-output buck-boost mode, power converter 26B may operate in CCM for larger output voltages (e.g., 7V<$V_{OUT}$<$V_{SUPPLY}$+2V) and DCM for smaller output voltages (e.g., 3V<$V_{OUT}$<7V). In DCM, peak current $I_{pk}$ of power inductor 62 may be given by:

$$I_{pk}=\sqrt{\frac{2\times I_{TGT}\times V_{OUT}\times TT}{L}}$$

where TT is a switching period of power converter 26.

In CCM, a duration of charging phase T1 may be given by T1=D×TT, where D is a unitless variable given by D=$V_{OUT}$/($V_{OUT}+V_{SUPPLY}$) and TT is a switching period of power converter 26B which is the sum of the durations of the charging phase T1 and the transfer phase T2 (e.g., TT=T1+T2). A change in power inductor current $I_L$ occurring during charging phase T1 may be given by $\Delta I_L$=T1×($V_{SUPPLY}/L$). A minimum inductor current $I_{min}$ may be given by:

$$I_{min}=[I_{OUT}\times TT\times V_{OUT}/L-\Delta I_L^2/2]/\Delta I_L$$

and a peak current $I_{pk}$ for inductor current $I_L$ may be given as $I_{pk}=I_{min}+\Delta I_L$.

Figures 18, 19:
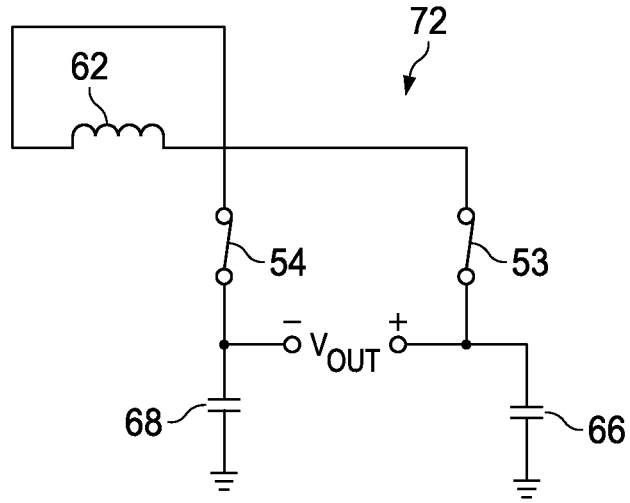
FIG. 18 illustrates an equivalent circuit diagram of selected components of the power converter of FIG. 12 operating in a discharge phase of a differential-output buck-boost mode, in accordance with embodiments of the present disclosure.
FIG. 19 illustrates a table setting forth switch configurations of the power converter of FIG. 12 when operating in a differential-output buck mode, in accordance with embodiments of the present disclosure.

Power converter 26B may operate in a differential-output buck mode when output voltage $V_{OUT}$ has a magnitude lower than that for which the duration of a charging phase T1 becomes too small to operate power converter in a buck-boost mode (e.g., $|V_{OUT}|<3V$) and a magnitude higher than for which the duration of a charging phase T1 becomes too small (e.g. $|V_{OUT}|>1V$) to operate power converter 26B in a buck mode. FIG. 19 illustrates a table setting forth switch configurations of power converter 26B when operating in the differential-output buck-boost mode, in accordance with embodiments of the present disclosure. As shown in FIG. 19, in the differential-output buck mode, switch configurations may not only be based on the polarity of output voltage $V_{OUT}$, but also on whether the common-mode voltage of the positive output terminal and the negative output terminal of power converter 26B is to be increased or decreased to regulate the common-mode voltage at a desired level, as shown in the column with the heading "CM" in FIG. 19. For example, in some embodiments, converter controller 24 may control switches of power converter 26B in order to regulate the common mode to a voltage associated with switched-mode amplifier 20. In some embodiments, the voltage may comprise one-half of the supply voltage $V_{SUPPLY}$.

Figure 20:
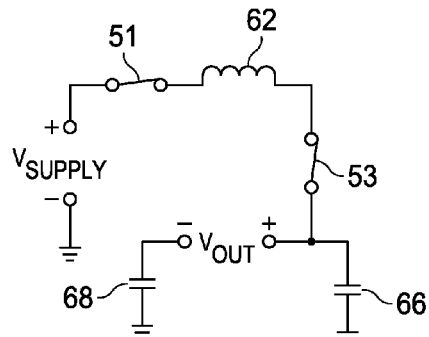
FIG. 20 illustrates an equivalent circuit diagram of selected components of the power converter of FIG. 12 operating in a charging phase of a differential-output buck mode, in accordance with embodiments of the present disclosure.
Figure 21:
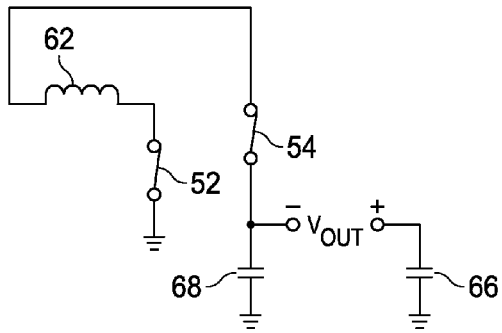
FIG. 21 illustrates an equivalent circuit diagram of selected components of the power converter of FIG. 12 operating in another charging phase of a differential-output buck mode, in accordance with embodiments of the present disclosure.
Figure 22:
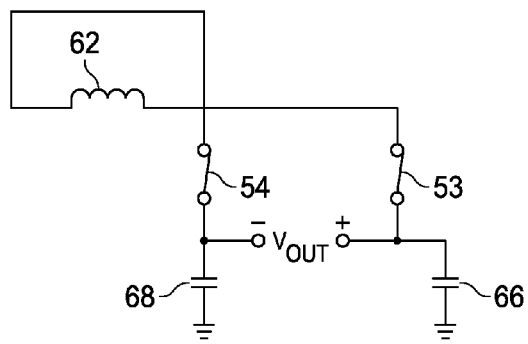
FIG. 22 illustrates an equivalent circuit diagram of selected components of the power converter of FIG. 12 operating in a discharge phase of a differential-output buck mode, in accordance with embodiments of the present disclosure.

As shown in FIG. 19, during a charging phase T1 of power converter 26B, when output voltage $V_{OUT}$ is positive and the common-mode voltage of the output terminals is to be increased, converter controller 24 may enable switches 51 and 53 of power converter 26B, with such switch configuration resulting in the equivalent circuit depicted in FIG. 20. In such switch configuration, power inductor 62 may be charged via a current flowing between the power supply (e.g., power supply 10) and the positive terminal of the output of power converter 26B, thus generating a positive output voltage $V_{OUT}$ and increasing the common-mode voltage by increasing the electrical charge on capacitor 66. On the other hand, during a charging phase T1 of power converter 26B, when output voltage $V_{OUT}$ is positive and the common-mode voltage of the output terminals is to be decreased, converter controller 24 may enable switches 52 and 54 of power converter 26B, with such switch configuration resulting in the equivalent circuit depicted in FIG. 21. In such switch configuration, power inductor 62 may be charged via a current flowing between the negative terminal of the output of power converter 26B and ground, thus generating a positive output voltage $V_{OUT}$ and decreasing common-mode voltage by decreasing the electrical charge on capacitor 68. During a discharge phase T2 of power converter 26B, when target current $I_{TGT}$ is positive and regardless of whether the common-mode voltage of the output terminals is to be increased or decreased, converter controller 24 may enable switches 53 and 54 of power converter 26B, with such switch configuration resulting in the equivalent circuit depicted in FIG. 22. In such switch configuration, power inductor 62 may be discharged, with charge transferred from the negative terminal of the output of power converter 26B to the positive terminal of the output of power converter 26B in order to provide a positive output voltage $V_{OUT}$ while maintaining the same common-mode voltage.

Similarly, during a charging phase T1 of power converter 26B, when output voltage $V_{OUT}$ is negative and the common-mode voltage of the output terminals is to be increased, converter controller 24 may enable switches 51 and 55 of power converter 26B. In such switch configuration, power inductor 62 may be charged via a current flowing between the power supply (e.g., power supply 10) and the negative terminal of the output of power converter 26B, thus generating a negative output voltage $V_{OUT}$ and increasing the common-mode voltage by increasing the electrical charge on capacitor 68. On the other hand, during a charging phase T1 of power converter 26B, when output voltage $V_{OUT}$ is negative and the common-mode voltage of the output terminals is to be decreased, converter controller 24 may enable switches 52 and 56 of power converter 26B. In such switch configuration, power inductor 62 may be charged via a current flowing between the positive terminal of the output of power converter 26B and ground, thus generating a negative output voltage $V_{OUT}$ and decreasing common-mode voltage by decreasing the electrical charge on capacitor 66. During a discharge phase T2 of power converter 26B, when output voltage $V_{OUT}$ is negative and regardless of whether the common-mode voltage of the output terminals is to be increased or decreased, converter controller 24 may enable switches 55 and 56 of power converter 26B. In such switch configuration, power inductor 62 may be discharged, with charge transferred from the positive terminal of the output of power converter 26B to the negative terminal of the output of power converter 26B in order to provide a negative output voltage $V_{OUT}$ while maintaining the same common-mode voltage.

Thus, during charging phases T1, converter controller 24 may cause power converter 26B to couple a capacitor 66 or 68 to supply voltage $V_{SUPPLY}$ or ground to increase or decrease the total amount of charge in capacitors 66 and 68 in order to regulate common-mode voltage of the output terminals. On the other hand, discharge phases T2 of converter controller 24 may cause power converter 26B to couple a power inductor 62 across the output terminals, which may redistribute charge between capacitors 66 and 68. Accordingly, in the differential-output buck mode, power converter 26B uses common-mode voltage at the output to create differential output voltage $V_{OUT}$, as the duration of charging phase T1 may determine the common mode voltage and differential voltage $V_{OUT}$ while the duration of discharge phase T2 may additionally determine the differential voltage $V_{OUT}$. As compared to other modes of operation, the differential-output buck mode provides for efficient charge transfer as charge is pushed to an output capacitor 66 or 68 during charging phase T1 and redistributed between output capacitors 66 and 66 during discharge phase T2. Because of such charge-transfer scheme, lower peak currents through power inductor 62 may be necessary to transfer charge as compared to other modes. Also, root-mean-square current through switch 51 may be reduced as it is not exercised as much as it is in other modes of operation, which may minimize power dissipation of switch 51. Common-mode voltage at the output terminals may also be well-controlled, as common-mode control is achieved by coupling an output capacitor 66 or 68 to supply voltage $V_{SUPPLY}$ or ground through power inductor 62.

When operating in the differential-output buck mode, power converter 26 may typically operate in DCM, unless power inductor 62 has a very high inductance (e.g., greater than 500 nH). In DCM, peak current $I_{pk}$ of power inductor 62 may be given by:

$$I_{pk} = \sqrt{\frac{2 \times I_{TGT} \times V_{OUT} \times (V_{SUPPLY} - V_{OUT}) \times TT}{L \times V_{SUPPLY}}}$$

where TT is a switching period of power converter 26B.

In CCM, a duration of charging phase T1 may be given by T1=D×TT, where D is a unitless variable given by D=$V_{OUT}$/($V_{OUT}$+$V_{SUPPLY}$) and TT is a switching period of power converter 26B which is the sum of the durations of the charging phase T1 and the transfer phase T2 (e.g., TT=T1+T2). A change in power inductor current $I_L$ occurring during charging phase T1 may be given by $\Delta I_L$=T1×($V_{SUPPLY}$−$V_{OUT}$)/2 L. A minimum inductor current $I_{min}$ may be given by:

$$I_{min}=[I_{OUT} \times TT \times (V_{SUPPLY}-V_{OUT}) \times TT/(L \times V_{SUPPLY})-\Delta I_L^2/2]/\Delta I_L$$

and a peak current $I_{pk}$ for inductor current IL may be given as $I_{pk}=I_{min}+\Delta I_L$.

In some embodiments, converter controller 24 may control switches of power converter 26B such that the switches perform synchronous rectification, wherein all switches of power converter 26B are controlled (e.g., disabled if inductor current $I_L$ decrease to zero) in order to prevent inductor current $I_L$ from decreasing below zero. In other embodiments, power converter 26B may include a diode (e.g., with anode terminal coupled to power inductor 62 and cathode terminal coupled to switches 53 and 55) in order to prevent inductor current $I_L$ from decreasing below zero.

In addition to providing switch control signals to power converter 26B, converter controller 24 may also provide a digital linear amplifier input signal to power converter 26 for controlling a current generated by a linear amplifier internal to power converter 26B, as described in greater detail below. As described above, power converter 26B may operate at magnitudes of output voltage $V_{OUT}$ for which the duration of the charging phase T1 remains high enough (e.g. $|V_{OUT}|>1V$) to operate power converter 26B in a buck mode. To provide for fine resolution of output voltages at magnitudes lower than the operational range of the differential-output buck mode, power converter 26B may operate in a linear DAC mode, in which linear amplifier 70 of FIG. 12, operating in effect as a DAC, may be used to convert a digital linear amplifier control signal (which may be indicative of a desired output current $I_{OUT}$) communicated from converter controller 24 into an analog current driven to a load coupled between output terminals of power converter 26B.

Figure 23:
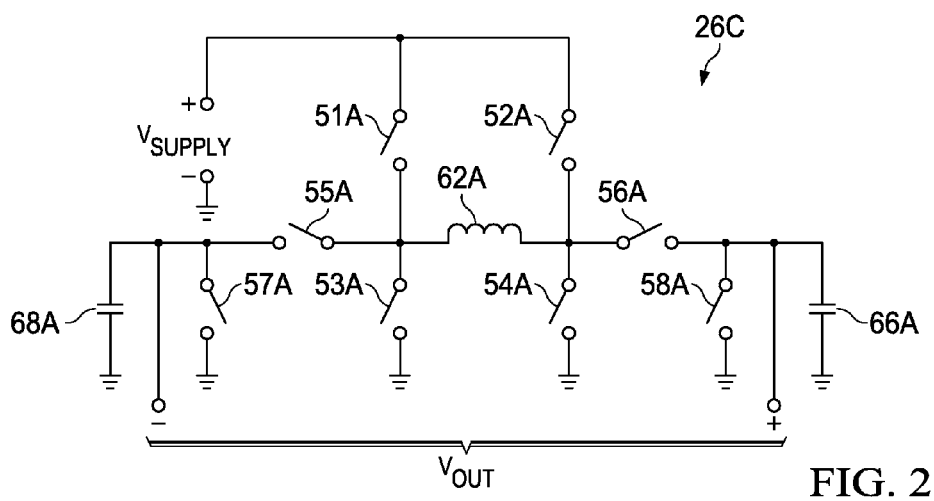
FIG. 23 illustrates a circuit diagram of selected components of another example power converter, in accordance with embodiments of the present disclosure.

FIG. 23 illustrates a circuit diagram of selected components of another example power converter 26C, in accordance with embodiments of the present disclosure. Power converter 26C may, in some embodiments, be used as an alternative to power converter 26B, and may in many respects, be mathematically equivalent to power converter 26B and/or operate in a similar manner to power converter 26B. As shown in FIG. 23, power converter 26C may receive at its input a voltage $V_{SUPPLY}$ (e.g., provided by power supply 10) at input terminals, including a positive input terminal and a negative input terminal which may be coupled to a ground voltage, and may generate at its output a differential output voltage $V_{OUT}$. Power converter 26C may comprise a power inductor 62A, and a plurality of switches 51A-58A. Although not shown in FIG. 23, power converter 26C may also include across its output terminals a linear amplifier identical or similar to linear amplifier 70 of power amplifier 26B. Power inductor 62A may comprise any passive two-terminal electrical component which resists changes in electrical current passing through it and such that when electrical current flowing through it changes, a time-varying magnetic field induces a voltage in power inductor 62A, in accordance with Faraday's law of electromagnetic induction, which opposes the change in current that created the magnetic field.

Each switch 51A-58A may comprise any suitable device, system, or apparatus for making a connection in an electric circuit when the switch is enabled (e.g., closed or on) and breaking the connection when the switch is disabled (e.g., open or off) in response to a control signal received by the switch. For purposes of clarity and exposition, control signals for switches 51A-58A (e.g., control signals communicated from converter controller 24) are not depicted although such control signals would be present to selectively enable and disable switches 51A-58A. In some embodiments, a switch 51A-58A may comprise an n-type metal-oxide-semiconductor field-effect transistor. Switch 51A may be coupled between the positive input terminal and a first terminal of power inductor 62A. Switch 52A may be coupled between the positive input terminal and a second terminal of power inductor 62A. Switch 53A may be coupled between the first terminal of power inductor 62A and the ground voltage. Switch 54A may be coupled between the second terminal of power inductor 62A and the ground voltage. Switch 55A may be coupled between the first terminal of power inductor 62A and a negative terminal of the output of power converter 26C. Switch 56A may be coupled between the second terminal of power inductor 62A and a positive terminal of the output of power converter 26C. Switch 57A may be coupled between the negative terminal of the output of power converter 26C and the ground voltage. Switch 58A may be coupled between the positive terminal of the output of power converter 26C and the ground voltage.

In addition to switches 51A-58B and power inductor 62A, power converter 26C may include a first output capacitor 66A coupled between the positive terminal of the output of power converter 26C and the ground voltage and a second output capacitor 68A coupled between the negative terminal of the output of power converter 26C and the ground voltage. Each output capacitor 66A and 68A may comprise a passive two-terminal electrical component used to store energy electrostatically in an electric field, and may generate a current in response to a time-varying voltage across the capacitor.

Figure 24:
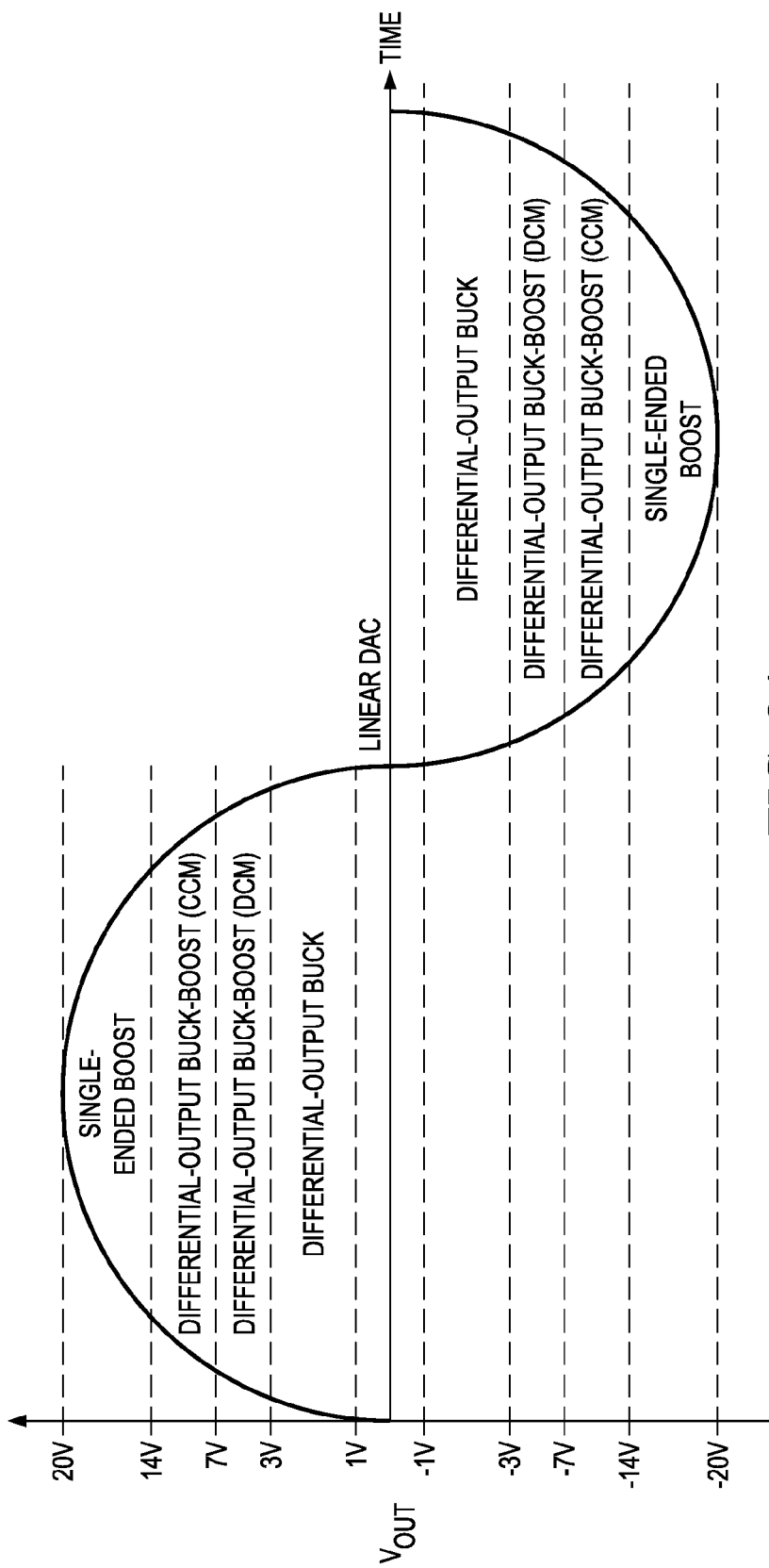
FIG. 24 illustrates a graph of an example output voltage having a sinusoidal waveform, the graph indicating example ranges for operation in the various operational modes of the power converter of FIG. 12, in accordance with embodiments of the present disclosure.

FIG. 24 illustrates a graph of an example output voltage $V_{OUT}$ having a sinusoidal waveform, the graph indicating example ranges for operation in the various operational modes of power converter 26B. Thus, for a full-scale sinusoidal signal, power converter 26B may sequentially operate in the linear DAC mode, the differential-output buck mode, the differential output buck-boost mode, the single-ended boost mode, the differential output buck-boost mode, the differential-output buck mode, and the linear DAC mode for each half-cycle of output voltage $V_{OUT}$.

Figure 25:
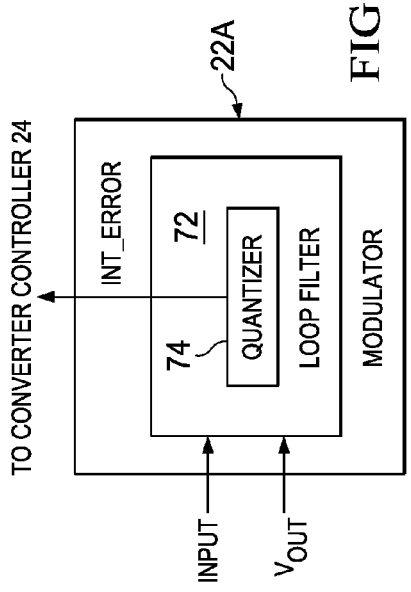
FIG. 25 illustrates a block diagram of selected components of an example modulator, in accordance with embodiments of the present disclosure.

FIG. 25 illustrates a block diagram of selected components of an example modulator 22A, in accordance with embodiments of the present disclosure. In some embodiments, modulator 22A depicted in FIG. 25 may implement all or a portion of modulator 22 described with respect to FIG. 4.

Modulator 22A may comprise any suitable system, device, or apparatus configured to generate an appropriate converter input signal such that converter controller 24 controls the plurality of switches of power converter 26 in order to generate a desired output voltage $V_{OUT}$ in response to an input signal INPUT. Input signal INPUT may be any suitable current, voltage, or power signal indicative of a target voltage to be generated as output voltage $V_{OUT}$. In some embodiments, input signal INPUT may comprise analog signal $V_{IN}$ or a derivative thereof. In other embodiments, input signal INPUT may comprise digital audio input signal DIG_IN or a derivative thereof, in which case modulator 22A and/or its components may perform the functionality of DAC 14. As shown in FIG. 25, modulator 22A may comprise a loop filter 72. Loop filter 72 may comprise any system, device, or apparatus configured to generate an integrated error INT_ERROR between output voltage $V_{OUT}$ and a target input voltage corresponding to input signal INPUT. In some embodiments, loop filter 72 may comprise a proportional-integral loop filter. In these and other embodiments, loop filter 72 may comprise a quantizer 74 configured to quantize the integrated error INT_ERROR calculated by loop filter 72 to one of a plurality of quantization levels. Such quantized integrated error may be communicated to converter controller 24, such that converter controller 24 may control switches of power converter 26 in accordance with a selected mode corresponding to such quantized integrated error. For example, in embodiments employing power converter 26A, the plurality of quantization levels may comprise a first quantization level for an integrated error less than −2.0 volts, a second quantization level for an integrated error between −2.0 volts and −1.5 volts, a third quantization level for an integrated error between −1.5 volts and −0.75 volts, a fourth quantization level for an integrated error between −0.75 volts and −0.25 volts, a fifth quantization level for an integrated error between −0.25 volts and 0.25 volts, a sixth quantization level for an integrated error between 0.25 volts and 0.75 volts, a seventh quantization level for an integrated error between 0.75 volts and 1.5 volts, an eighth quantization level for an integrated error between 1.5 volts and 2.0 volts, and a ninth quantization level for an integrated error greater than 2.0 volts. In such embodiments, the first quantization level and the ninth quantization level may correspond to a first sub-mode of the boost mode of power converter 26A, the second quantization level and the eight quantization level may correspond to a second sub-mode of the boost mode of power converter 26A, the third quantization level and the seventh quantization level may correspond to a first sub-mode of the buck mode of power converter 26A, the fourth quantization level and the sixth quantization level may correspond to a second sub-mode of the buck mode of power converter 26A, and the fifth quantization level may correspond to the hold mode. Notably, because the input signal INPUT may vary over time, integrated error INT_ERROR may sequentially switch among the various quantization levels.

Figure 26:
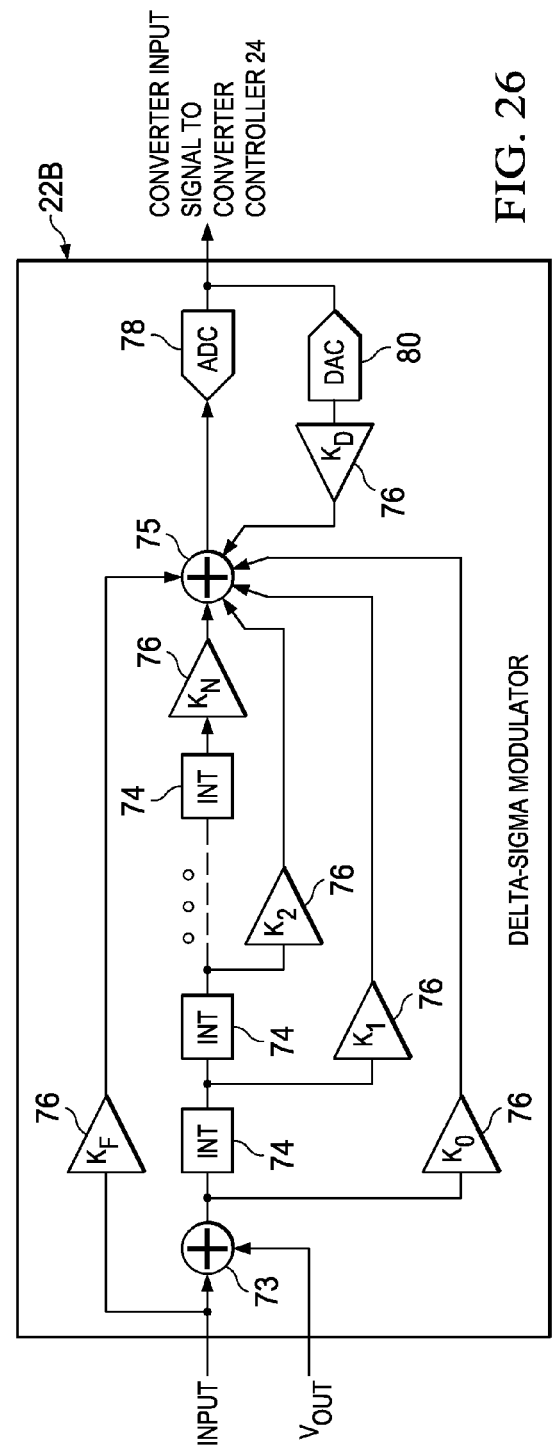
FIG. 26 illustrates a block diagram of selected components of another example modulator, in accordance with embodiments of the present disclosure.

FIG. 26 illustrates a block diagram of selected components of an example modulator 22B, in accordance with embodiments of the present disclosure. In some embodiments, modulator 22B depicted in FIG. 26 may implement all or a portion of modulator 22 described with respect to FIG. 4.

Modulator 22B may comprise a delta-sigma modulator or similar modulator which may have the function of moving quantization errors outside the audio band. Modulator 22B may include a loop filter which comprises an input summer 73 for generating a difference between an input signal (e.g., an analog voltage signal $V_{IN}$) and a feedback signal (e.g., output voltage $V_{OUT}$), and one or more integrator stages 74, such that the loop filter operates as analog filter of an error signal equal to the difference between the input signal and the feedback signal, and generates, at the output of output summer 75 a filtered analog signal to analog-to-digital converter (ADC) 78 based on the input signal and the feedback signal. The inputs to output summer 75 may include the input signal as modified by a feed-forward gain coefficient $K_F$ applied by a gain element 76, the outputs of individual integrator stages 74 as each is modified by a respective integrator gain coefficient $K_1, K_2, \ldots, K_N$ applied by gain elements 76, and the output of a feedback digital-to-analog converter 80 as modified by a delay-compensation coefficient $K_F$ applied by a gain element 76 in order to compensate for excess loop delay of the loop filter.

ADC 78 may comprise any system, device, or apparatus for converting the analog output signal generated by the loop filter (e.g., the output of output summer 75) into an equivalent digital signal, which, in some embodiments, may represent a desired output voltage to be generated at the output of switched mode amplifier 20 (e.g., across the terminals labeled $V_{OUT}$ in FIG. 5). Such digital signal or a derivative thereof (e.g., a current signal based on the input signal) may be communicated to converter controller 24, such that converter controller 24 may control switches of power converter 26 in accordance with a selected mode corresponding to such quantized integrated error.

DAC 80 may comprise any suitable system, device, or apparatus configured to convert the digital signal into an equivalent analog feedback signal.

Figure 27:
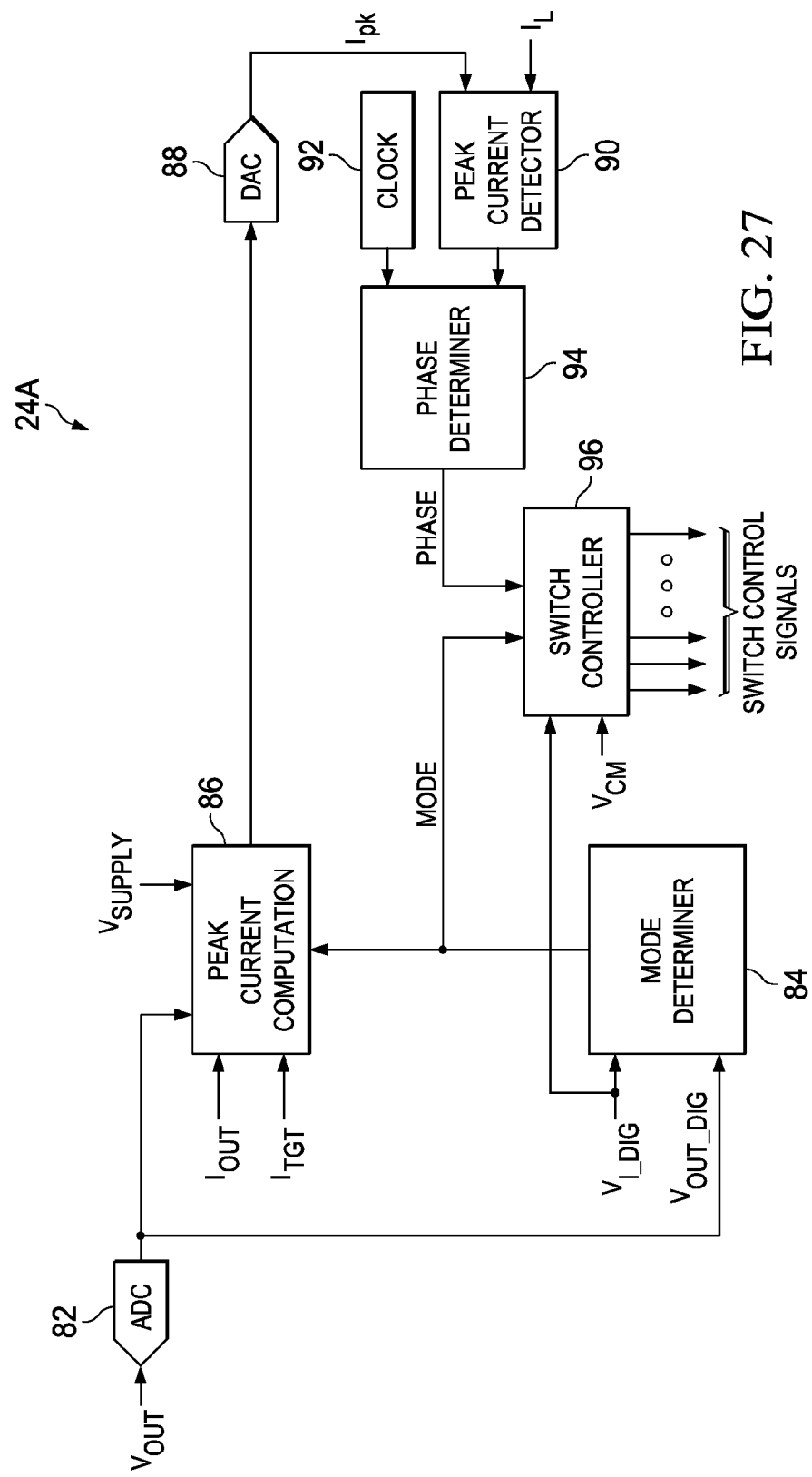
FIG. 27 illustrates a block diagram of selected components of a power converter control, in accordance with embodiments of the present disclosure.

FIG. 27 illustrates a block diagram of selected components of an example converter controller 24A, in accordance with embodiments of the present disclosure. In some embodiments, converter controller 24A depicted in FIG. 27 may implement all or a portion of converter controller 24 described with respect to FIG. 4. In the embodiments represented by FIG. 27 the controller input signal received by converter controller 24A is a target current signal $I_{TGT}$. As shown in FIG. 27, converter controller 24A may implement an ADC 82, a mode determiner 84, a peak current computation block 86, a DAC 88, a peak current detector 90, a clock 92, a phase determiner 94, and a switch controller 96.

ADC 82 may comprise any system, device, or apparatus configured to convert analog output voltage $V_{OUT}$ (or a derivative thereof) into an equivalent digital signal $V_{OUT\_DIG}$.

Mode determiner 84 may comprise any system, device, or apparatus configured to select a mode of operation from a plurality of modes of operation (e.g., single-ended boost mode, differential-output buck-boost mode, differential-output buck mode, linear DAC mode, etc.) based on digital output voltage signal $V_{OUT\_DIG}$ (or another signal indicative of output voltage $V_{OUT}$) and/or a digital input voltage signal $V_{I\_DIG}$ indicative of input voltage $V_{IN}$. For example, mode determiner 82 may select the mode of operation based upon a voltage range of digital output voltage signal $V_{OUT\_DIG}$ and/or digital input voltage signal $V_{I\_DIG}$ (e.g., select single-ended boost mode for $|V_{FB}|>14V$), select differential-output buck-boost mode for $3V<|V_{FB}|<14V$, select differential-output buck mode for $1V<|V_{FB}|<3V$, and select linear DAC mode for $|V_I|<1V$.

Peak current computation block 86 may comprise any system, device, or apparatus configured to compute a peak current $I_{pk}$ to be driven through power inductor 62 during a switching cycle of power converter 26. Such peak current $I_{pk}$ may be calculated based on the selected mode of operation, digital output voltage signal $V_{OUT\_DIG}$ (or another signal indicative of output voltage $V_{OUT}$), supply voltage $V_{SUPPLY}$, output current $I_{OUT}$ (or another signal indicative of output current $I_{OUT}$), and/or target current $I_{TGT}$ in accordance with the various equations for peak current $I_{pk}$ set forth above.

DAC 88 may comprise any system, device, or apparatus configured to convert a digital signal generated by peak current computation block 106 indicative of peak current $I_{pk}$ into an equivalent analog peak current signal $I_{pk}$.

Peak current detector 90 may comprise any system, device, or apparatus configured to compare power inductor current $I_L$ to the analog peak current signal $I_{pk}$ and generate an output signal indicative of the comparison, thus providing an indication for when power inductor current $I_L$ has reached its desired peak current. Power inductor current $I_L$ has reaching its desired peak current may indicate the end of a charging phase T1 and beginning of a transfer phase T2 of power converter 26.

Clock 92 may comprise any system, device, or apparatus configured to generate a periodic timing signal indicative of an occurrence of or within a switching cycle of power converter 26. For example, a zero crossing, edge, or other characteristic of a waveform generated by clock 92 may indicate the beginning of a charging phase T1 of power converter 26.

Phase determiner 94 may comprise any system, device, or apparatus configured to, based on the outputs of peak current detector 90 and clock 92, determine which phase (e.g., charging phase T1 or discharge phase T2) power converter 26 is to operate.

Switch controller 96 may comprise any system, device, or apparatus configured to, based on the mode of operation, phase, polarity of digital input signal $V_{I\_DIG}$ (or another signal indicative of input voltage $V_{IN}$ or output voltage $V_{OUT}$), and (for the differential-output buck mode of power converter 26B) a common-mode voltage $V_{CM}$ of the output terminals of power converter 26, generate switch control signals for controlling the switches of power converter 26.

Thus, during each switching cycle for converter controller 24A, converter controller 24A may select a mode of operation based on input voltage $V_{IN}$ and output voltage $V_{OUT}$, calculate a peak current $I_{pk}$ based on input voltage $V_{IN}$, output voltage $V_{OUT}$, target current signal $I_{TGT}$, and/or output current $I_{OUT}$, and use information regarding the selected mode and the phase of power converter 26 to select a switch configuration to control the switches of power converter 26. In alternative embodiments, rather than operating as a peak current system as depicted in FIG. 27, converter controller 24 may operate as a time-based system based on measurements of supply voltage $V_{SUPPLY}$, output voltage $V_{OUT}$, and output current $I_{OUT}$.

Thus, in the various embodiments disclosed herein, the choice of sequence for switches of power converter 26 may be made consistent with a desired change in output voltage $V_{OUT}$. By repeatedly increasing and decreasing output voltage $V_{OUT}$ in small steps, output voltage $V_{OUT}$ may be made to follow, on average, the desired audio signal. Accordingly, quantization error present in output voltage $V_{OUT}$ may be moved outside the audio band in a manner similar to a delta-sigma modulator.

As used herein, absolute voltage values (e.g., 0.25V, 0.75 V, 1.5V, 2.0V for power converter 26A; 1V, 3V, 7V, 14V for power converter 26B) are given merely as examples, and any other suitable voltages may be used to define ranges of operation of the various power converter modes described herein.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A switching power stage for producing an output voltage to a load, comprising:
a power converter comprising a power inductor and plurality of switches arranged to sequentially operate in a plurality of switch configurations; and
a controller configured to:
select a selected operational mode of the power converter from a plurality of operational modes, the plurality of operational modes comprising at least:
a first operational mode in which a first terminal of the load is at a voltage potential lower than that of a first terminal of a power source to the power converter, the first terminal of the load is at a voltage potential higher than that of a second terminal of the power source, and a second terminal of the load is at a voltage potential higher than that of the second terminal of the power source; and
a second operational mode in which only one of the first terminal of the load and the second terminal of the load has a low resistance path to one of the first terminal of the power source and the second terminal of the power source; and
sequentially apply switch configurations from the plurality of switch configurations to selectively activate or deactivate each of the plurality of switches in order to transfer electrical energy from an input source of the power converter to the load in accordance with the selected operational mode.

2. The switching power stage of claim 1, wherein the controller is configured to select the selected operational mode in order to regulate a common mode voltage of the first terminal of the load and the second terminal of the load approximately equal to a maximum of a first voltage associated with the switching power stage and a second voltage associated with the switching power stage.

3. The switching power stage of claim 2, wherein the first voltage comprises one-half of a voltage potential between the first terminal of the power source and the second terminal of the power source.

4. The switching power stage of claim 3, wherein the second voltage comprises one-half of the output voltage.

5. The switching power stage of claim 3, wherein the second voltage comprises one-half of an expected output voltage, wherein the expected output voltage is based on an input signal to the switching power stage.

6. The switching power stage of claim 5, wherein the input signal is an audio signal.

7. The switching power stage of claim 1, wherein the power source is a battery.

8. The switching power stage of claim 1, wherein the controller is further configured to, in the first operational mode:
- based at least on an input signal to the switching power stage, determine the differential output voltage to be driven at the load; and
- based on the differential output voltage to be driven at the load, apply a switch configuration from the plurality of switch configurations to selectively activate or deactivate each of the plurality of switches in order to generate the differential output voltage.

9. The switching power stage of claim 8, wherein the switch configuration comprises a configuration in which the power inductor is coupled between a terminal of the load and a terminal of a power source to the switching power stage in order to transfer charge between the terminal of the load and the terminal of the power source to increase the differential output voltage.

10. The switching power stage of claim 8, wherein the switch configuration comprises a configuration in which the power inductor is coupled between a terminal of the load and a terminal of a power source to the switching power stage in order to transfer charge between the terminal of the load and the terminal of the power source to decrease the differential output voltage.

11. The switching power stage of claim 8, wherein the switch configuration comprises a configuration in which the power inductor is coupled between terminals of the load in order to transfer charge between the terminals of the load to increase the differential output voltage.

12. The switching power stage of claim 8, wherein the switch configuration comprises a configuration in which the power inductor is coupled between terminals of the load in order to transfer charge between the terminals of the load to decrease the differential output voltage.

13. The switching power stage of claim 1, wherein at least one of the plurality of operational modes comprises a converter mode.

14. The switching power stage of claim 13, wherein the converter mode comprises one of a boost mode, a buck mode, and a buck-boost mode.

15. A switching power stage for producing a differential output voltage to a load, comprising:
- a power converter comprising a power inductor and plurality of switches arranged to sequentially operate in a plurality of switch configurations, wherein the plurality of switch configurations includes a first configuration in which the power converter only drives a first terminal of the load and a second configuration in which the power converter only drives a second terminal of the load; and
- a controller configured to:
  - based at least on an input signal to the switching power stage, determine the differential output voltage to be driven at the load, wherein the differential output voltage equals a difference between a first voltage potential at the first terminal of the load and a second voltage potential at the second terminal of the load and wherein the differential output voltage is substantially different from each of the first voltage potential and the second voltage potential; and
  - based on the differential output voltage to be driven at the load, apply a switch configuration from the plurality of switch configurations to selectively activate or deactivate each of the plurality of switches in order to generate the differential output voltage.

16. The switching power stage of claim 15, wherein the switch configuration comprises a configuration in which the power inductor is coupled between a terminal of the load and a terminal of a power source to the switching power stage in order to transfer charge between the terminal of the load and the terminal of the power source to increase the differential output voltage.

17. The switching power stage of claim 15, wherein the switch configuration comprises a configuration in which the power inductor is coupled between a terminal of the load and a terminal of a power source to the switching power stage in order to transfer charge between the terminal of the load and the terminal of the power source to decrease the differential output voltage.

18. The switching power stage of claim 15, wherein the switch configuration comprises a configuration in which the power inductor is coupled between terminals of the load in order to transfer charge between the terminals of the load to increase the differential output voltage.

19. The switching power stage of claim 15, wherein the switch configuration comprises a configuration in which the power inductor is coupled between terminals of the load in order to transfer charge between the terminals of the load to decrease the differential output voltage.

20. A method for producing an output voltage to a load, comprising:
- selecting a selected operational mode for a power converter comprising a power inductor and plurality of switches arranged to sequentially operate in a plurality of switch configurations, the plurality of operational modes comprising at least:
  - a first operational mode in which a first terminal of the load is at a voltage potential lower than that of a first terminal of a power source to the power converter, the first terminal of the load is at a voltage potential higher than that of a second terminal of the power source, and a second terminal of the load is at a voltage potential higher than that of the second terminal of the power source; and
  - a second operational mode in which only one of the first terminal of the load and the second terminal of the load has a low resistance path to one of the first terminal of the power source and the second terminal of the power source; and
- sequentially applying switch configurations from the plurality of switch configurations to selectively activate or deactivate each of the plurality of switches in order to transfer electrical energy from an input source of the power converter to the load in accordance with the selected operational mode.

21. The method of claim 20, wherein selecting the selected operational mode comprises selecting the selected operational mode in order to regulate a common mode voltage of the first terminal of the load and the second terminal of the load approximately equal to a maximum of a first voltage associated with the switching power stage and a second voltage associated with the switching power stage.

22. The method of claim 21, wherein the first voltage comprises one-half of a voltage potential between the first terminal of the power source and the second terminal of the power source.

23. The method of claim 22, wherein the second voltage comprises one-half of the output voltage.

24. The method of claim 22, wherein the second voltage comprises one-half of an expected output voltage, wherein the expected output voltage is based on an input signal to the switching power stage.

25. The method of claim 24, wherein the input signal is an audio signal.

26. The method of claim 24, wherein the power source is a battery.

27. The method of claim 20, further comprising, in the first operational mode:
- based at least on an input signal to the switching power stage, determining a differential output voltage to be driven at the load; and
- based on the differential output voltage to be driven at the load, applying a switch configuration from the plurality of switch configurations to selectively activate or deactivate each of the plurality of switches in order to generate the differential output voltage.

28. The method of claim 27, wherein the switch configuration comprises a configuration in which the power inductor is coupled between a terminal of the load and a terminal of a power source to the switching power stage in order to transfer charge between the terminal of the load and the terminal of the power source to increase the differential output voltage.

29. The method of claim 27, wherein the switch configuration comprises a configuration in which the power inductor is coupled between a terminal of the load and a terminal of a power source to the switching power stage in order to transfer charge between the terminal of the load and the terminal of the power source to decrease the differential output voltage.

30. The method of claim 27, wherein the switch configuration comprises a configuration in which the power inductor is coupled between terminals of the load in order to transfer charge between the terminals of the load to increase the differential output voltage.

31. The method of claim 27, wherein the switch configuration comprises a configuration in which the power inductor is coupled between terminals of the load in order to transfer charge between the terminals of the load to decrease the differential output voltage.

32. The method of claim 20, wherein at least one of the plurality of operational modes comprises a converter mode.

33. The method of claim 32, wherein the converter mode comprises one of a boost mode, a buck mode, and a buck-boost mode.

34. A method for producing an output voltage to a load, comprising:
- based at least on an input signal to a switching power stage for producing a differential output voltage to a load, wherein the switching power stage comprises a power inductor and plurality of switches arranged to sequentially operate in a plurality of switch configurations and wherein the plurality of switch configurations includes a first configuration in which the power converter only drives a first terminal of the load and a second configuration in which the power converter only drives a second terminal of the load, determining the differential output voltage to be driven at the load, wherein the differential output voltage equals a difference between a first voltage potential at a first terminal of the load and a second voltage potential at a second terminal of the load and wherein the differential output voltage is substantially different from each of the first voltage potential and the second voltage potential; and
- based on the differential output voltage to be driven at the load, applying a switch configuration from the plurality of switch configurations to selectively activate or deactivate each of the plurality of switches in order to generate the differential output voltage.

35. The method of claim 34, wherein the switch configuration comprises a configuration in which the power inductor is coupled between a terminal of the load and a terminal of a power source to the switching power stage in order to transfer charge between the terminal of the load and the terminal of the power source to increase the differential output voltage.

36. The method of claim 34, wherein the switch configuration comprises a configuration in which the power inductor is coupled between a terminal of the load and a terminal of a power source to the switching power stage in order to transfer charge between the terminal of the load and the terminal of the power source to decrease the differential output voltage.

37. The method of claim 34, wherein the switch configuration comprises a configuration in which the power inductor is coupled between terminals of the load in order to transfer charge between the terminals of the load to increase the differential output voltage.

38. The method of claim 34, wherein the switch configuration comprises a configuration in which the power inductor is coupled between terminals of the load in order to transfer charge between the terminals of the load to decrease the differential output voltage.

* * * * *